United States Patent
Sakauchi

(10) Patent No.: US 12,227,631 B2
(45) Date of Patent: Feb. 18, 2025

(54) CURED PRODUCT AND PRODUCTION METHOD OF SAME, AND RESIN SHEET AND RESIN COMPOSITION

(71) Applicant: Ajinomoto Co., Inc., Tokyo (JP)

(72) Inventor: Hiroyuki Sakauchi, Kawasaki (JP)

(73) Assignee: Ajinomoto Co., Inc., Tokyo (JP)

( * ) Notice: Subject to any disclaimer, the term of this patent is extended or adjusted under 35 U.S.C. 154(b) by 666 days.

(21) Appl. No.: 16/842,180

(22) Filed: Apr. 7, 2020

(65) Prior Publication Data

US 2020/0231786 A1 Jul. 23, 2020

Related U.S. Application Data

(63) Continuation of application No. PCT/JP2018/034632, filed on Sep. 19, 2018.

(30) Foreign Application Priority Data

Oct. 10, 2017 (JP) .................. 2017-197132

(51) Int. Cl.
| | | |
|---|---|---|
| *C08K 9/06* | (2006.01) | |
| *C08G 59/42* | (2006.01) | |
| *C08K 7/26* | (2006.01) | |
| *C08L 63/00* | (2006.01) | |
| *H01L 23/29* | (2006.01) | |
| *H05K 1/03* | (2006.01) | |

(52) U.S. Cl.
CPC ............ *C08K 9/06* (2013.01); *C08G 59/4238* (2013.01); *C08K 7/26* (2013.01); *C08L 63/00* (2013.01); *H01L 23/295* (2013.01); *H05K 1/0373* (2013.01); *C08K 2201/003* (2013.01); *C08L 2205/035* (2013.01)

(58) Field of Classification Search
CPC ... C08K 7/18; C08K 9/06; C08K 3/36; C08K 7/26; H05K 1/0373; C08L 63/00–10; C09D 163/00–10; C09J 163/00–10; C08J 2363/00–10
See application file for complete search history.

(56) References Cited

U.S. PATENT DOCUMENTS

| | | | | |
|---|---|---|---|---|
| 5,461,090 A * | 10/1995 | Sweet | ................... | C08G 59/18 |
| | | | | 523/404 |
| 2002/0082349 A1 | 6/2002 | Takahashi et al. | | |
| 2003/0216505 A1* | 11/2003 | Akiba | ................... | C08L 101/00 |
| | | | | 524/588 |
| 2006/0223913 A1* | 10/2006 | Osada | ................... | C08L 63/00 |
| | | | | 523/452 |
| 2009/0247032 A1* | 10/2009 | Mori | ................... | C08L 71/126 |
| | | | | 428/457 |
| 2012/0123021 A1 | 5/2012 | Yano et al. | | |
| 2016/0244605 A1 | 8/2016 | Kim et al. | | |
| 2019/0284395 A1* | 9/2019 | Kasahara | ................ | C08L 79/08 |
| 2020/0172724 A1* | 6/2020 | Fujii | ................ | C08K 7/26 |

FOREIGN PATENT DOCUMENTS

| | | |
|---|---|---|
| CN | 106916400 A | 7/2017 |
| JP | 2000-212759 | 8/2000 |
| JP | 2001-019834 | 1/2001 |
| JP | 2001-098174 | 4/2001 |
| JP | 2003-46247 A | 2/2003 |
| JP | 2006-093618 | 4/2006 |
| JP | 2007-056158 | 3/2007 |
| JP | 2007-161518 | 6/2007 |
| JP | 2011-021068 | 2/2011 |
| JP | 2011-021101 | 2/2011 |
| JP | 2011-225756 | 11/2011 |
| JP | 2011-225799 A | 11/2011 |
| JP | 2012-057003 | 3/2012 |
| JP | 2012-074606 | 4/2012 |
| JP | 2012-136693 | 7/2012 |
| JP | 2012-167256 | 9/2012 |
| JP | 2013077726 A * | 4/2013 |
| JP | 2013-115171 A | 6/2013 |
| JP | 2013-173841 | 9/2013 |
| JP | 2014-015606 | 1/2014 |
| JP | 2017-75221 A | 4/2017 |
| JP | 2017-082201 | 5/2017 |
| JP | 2017-114687 A | 6/2017 |
| TW | 201731947 A | 9/2017 |
| WO | WO-2018097010 A1 * | 5/2018 ............ B32B 15/08 |
| WO | WO 2018/225599 A1 | 12/2018 |

OTHER PUBLICATIONS

Partial machine translation of WO-2018097010-A1 (2018).*
Partial machine translation of JP-2013077726-A (Year: 2013).*
Combined Chinese Office Action and Search Report issued May 6, 2022 in Chinese Patent Application No. 201880065943.9 (with unedited computer generated English translation), 20 pages.
Japanese Office Action issued Mar. 8, 2022 in Japanese Patent Application No. 2019-547964 (with English translation), 6 pages.
International Search Report issued in Application No. PCT/JP2018/034632 issued Dec. 18, 2018.
Office Action issued Jun. 6, 2023, in corresponding Japanese Patent Application No. 2022-129399 (with English Translation), 6 pages.
Taiwanese Office Action issued on Jan. 15, 2024 in Taiwanese Patent Application No. 111136324 (with English translation), 17 pages.

* cited by examiner

*Primary Examiner* — Kregg T Brooks
(74) *Attorney, Agent, or Firm* — Oblon, McClelland, Maier & Neustadt, L.L.P.

(57) ABSTRACT

Cured products that are formed of a cured material obtained by curing a resin composition including (A) at least one epoxy resin, (B) at least one curing agent, and (C) at least one inorganic filler, and have a ground surface, in which the maximum depth of a depressed portion present on the ground surface is less than 10 μm are useful for making printed wiring boards.

15 Claims, 9 Drawing Sheets

CURED PRODUCT AND PRODUCTION METHOD OF SAME, AND RESIN SHEET AND RESIN COMPOSITION

CROSS REFERENCES TO RELATED APPLICATIONS

This application is a continuation of International Patent Application No. PCT/JP2018/034632, filed on Sep. 19, 2018, and claims priority to Japanese Patent Application No. 2017-197132, filed on Oct. 10, 2017, both of which are incorporated herein by reference in their entireties.

BACKGROUND OF THE INVENTION

Field of the Invention

The present invention relates to cured products that are formed of a cured material obtained by curing a resin composition and has a ground surface. The present invention also relates to production methods of the cured product, resin sheets comprising a resin composition layer comprising a resin composition and resin compositions,

Discussion of the Background

With regard to a method for producing a wiring board, a build-up method is widely used in which a wiring layer as a circuit-formed conductive layer and an insulating layer are alternately piled up. It is known that the insulating layer is formed of a cured material obtained by curing a resin composition.

In recent years, there is a trend that an electronic device is made further lighter, thinner, shorter, and smaller. With this trend, a flexible wiring board that can be folded so as to be able to be accommodated into an electronic device is wanted. In addition, in order to achieve a further thinner wiring board, a wiring board having an embedded-type wiring layer is wanted (for example, see Japanese Patent Application Laid-open No. 2017-82201).

SUMMARY OF THE INVENTION

In order to reduce mismatch of an average coefficient of linear thermal expansion (CTE: this is sometimes called thermal expansion rate) between a wiring layer and an insulating layer, a hard material having a large amount of inorganic filler contained therein has been used as the material for the insulating layer to be used in a wiring board including an embedded-type wiring layer.

In order to lower the average coefficient of linear thermal expansion, a material having a large amount of inorganic filler contained in a flexible resin has been investigated as the material for the insulating layer to be used in a wiring board including an embedded-type wiring layer.

In the afore-mentioned circumstances, in order to expose the embedded-type wiring layer that is embedded in the insulating layer, the inventors of the present invention carried out grinding of the insulating layer. Furthermore, on a ground surface formed by the grinding, the inventors attempted to form a rewiring layer to be connected with the wiring layer. However, when a conventional insulating layer was used, it was found that a fine rewiring layer was difficult to be formed thereby resulting in a low yield.

With regard to the insulating layer having a component embedded therein, the inventors of the present invention carried out the same investigation. Specifically, in order to expose a terminal of the component that is embedded in the insulating layer, it was attempted to form a ground surface by grinding the insulating layer so as to form the rewiring layer on the ground surface. However, when a conventional insulating layer was used, it was found again that a fine rewiring layer was difficult to be formed thereby resulting in a low yield.

Therefore, the inventors of the present invention carried out further investigation, and as a result, it was found that the ground surface of the conventional insulating layer was so poor in uniform applicability thereon that the rewiring layer was difficult to be formed.

Usually, when the rewiring layer is formed on the ground surface, a photosensitive resin as a photoresist is applied onto the ground surface to form a thin film layer. Then, after a part of the thin film layer (specifically, a part corresponding to the wiring layer or the terminal) is removed, the rewiring layer is formed. The rewiring layer is formed directly onto the ground surface on a place where the thin film layer is removed. The rewiring layer is formed on the ground surface via the thin film layer on a place where the thin film layer is not removed.

When the ground surface is poor in the uniform applicability, the thin film layer is not uniform, thereby sometimes resulting in a defect. The "defect" means the place where a height of the surface of the thin film layer is lower than the surrounding area thereof because the thin film layer is not formed or the surface of the thin film layer is locally depressed. The defect is usually very small. However, when a fine rewiring layer is intended to be formed, on the place where the defect is formed, it is difficult to form the rewiring layer as it is intended.

The present invention was conceived in view of the problem mentioned above, and thus, one object of the present invention is to provide a cured product that is formed of a cured material obtained by curing a resin composition comprising (A) an epoxy resin, (B) a curing agent, and (C) an inorganic filler, and has ground surface having a superior uniform applicability of a resin.

It is another object of the present invention to provide a production method of such a cured product.

It is another object of the present invention to provide a resin sheet and a resin composition from which the cured product can be produced.

These and other objects, which will become apparent during the following detailed description, have been achieved by the inventors' discovery that the ground surface has a very small depressed portion inevitably formed thereon thereby causing a decrease in the uniform applicability on the ground surface.

Thus, the present invention includes the following aspects.

(1) A cured product formed of a cured material obtained by curing a resin composition comprising (A) an epoxy resin, (B) a curing agent, and (C) an inorganic filler, wherein
the cured product has a ground surface, and
a maximum depth of a depressed portion present on the ground surface is less than 10 μm.

(2) The cured product according to (1), wherein the (B) component is a phenol-based curing agent or an acid anhydride-based curing agent.

(3) The cured product according to (1) or (2), wherein an average particle diameter of the (C) component is 0.5 μm to 20 μm.

(4) The cured product according to any one of (1) to (3), wherein the (C) component is treated with an amino silane compound or an epoxy silane compound.

(5) The cured product according to any one of (1) to (4), wherein
the ground surface includes a filler surface part formed by grinding of the (C) component, and
a depressed portion having a depth of less than 10 μm is formed on the filler surface part.

(6) The cured product according to any one of (1) to (5), wherein
the (C) component includes a hollow filler particle having a hollow portion formed inside thereof, and
a maximum long diameter of the hollow portion of the hollow filler particle included in the (C) component is less than 5 μm.

(7) The cured product according to any one of (1) to (6), wherein the cured product is for formation of a rewiring layer on the ground surface.

(8) The cured product according to any one of (1) to (7), wherein the cured product is included in a structural body in combination with a connection terminal portion having a surface portion that is flush with the ground surface, and the cured product is for formation of a rewiring layer on the ground surface.

(9) The cured product according to any one of (1) to (8), wherein the cured product is for formation of a rewiring layer after a thin film layer is formed on the ground surface.

(10) A method for producing the cured product according to any one of (1) to (9), the method comprising the steps of:
forming a resin composition layer of the resin composition,
curing the resin composition to obtain a cured product, and
grinding the curd product.

(11) A resin sheet comprising a support and a resin composition layer comprising a resin composition, the resin composition layer being provided on the support, wherein
the resin composition comprises (A) an epoxy resin, (B) a curing agent, and (C) an inorganic filler, and
when the resin composition is cured at 180° C. for 1 hour, and then ground to form a ground surface having an arithmetic average roughness of 500 nm or less, a maximum depth of a depressed portion present on the ground surface is less than 10 μm.

(12) A resin composition comprising (A) an epoxy resin, (B) a curing agent, and (C) an inorganic filler, wherein
the resin composition is a liquid resin composition, and
when the resin composition is cured at 180° C. for 1 hour, and then ground to form a ground surface having an arithmetic average roughness of 500 nm or less, a maximum depth of a depressed portion present on the ground surface is less than 10 μm.

(13) A resin composition for obtaining a cured product having a ground surface to form a rewiring layer thereon, wherein
the resin composition comprises (A) an epoxy resin, (B) a curing agent, and (C) an inorganic filler,
an average particle diameter of the (C) component is 0.5 μm to 20 μm,
the (C) component is treated with an amino silane compound or an epoxy silane compound,
the (C) component includes a hollow filler particle having a hollow portion formed inside thereof, and
a maximum long diameter of the hollow portion of the hollow filler particle included in the (C) component is less than 5 μm.

Advantageous Effects of Invention

The present invention can provide: a cured product that is formed of a cured material obtained by curing a resin composition comprising (A) an epoxy resin, (B) a curing agent, and (C) an inorganic filler, and has ground surface having a superior uniform applicability of a resin; a production method of the cured product; and a resin sheet and a resin composition from which the cured product can be produced.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

EXPLANATION OF REFERENCES

Figure 1:
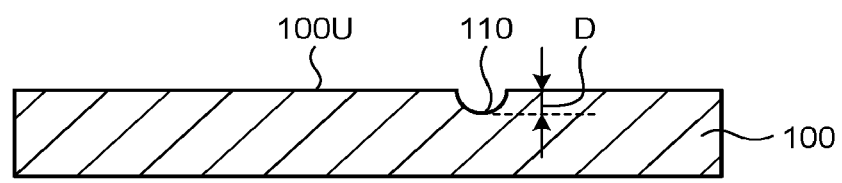
FIG. 1 is a sectional view schematically illustrating the cured product as one embodiment of the present invention.

100 cured product
100U ground surface
110 depressed portion
200 hollow filler particle
210 hollow portion
300 cured product
300U ground surface
310 depressed portion
320 particle of inorganic filler
400 cured product
400U ground surface
410 depressed portion
420 hollow filler particle
420U filler surface part
430 hollow portion
500 wiring board
500U structural body-ground surface
510 cured layer
510U cured product-ground surface
520 wiring layer
520U terminal-ground surface
530 substrate
531 board
532 first metal layer
533 second metal layer
540 wiring layer-attached substrate
600 component-incorporated circuit board
600U structural body-ground surface
610 board
610H cavity
611 wiring layer
620 cured layer
620U cured product-ground surface
630 insulating layer
640 component
641 terminal
641U terminal-ground surface
650 temporarily attaching member
660 temporarily component-attached substrate
700 wiring board
700U structural body-ground surface
730 chip
731 pillar portion
731U terminal-ground surface
800 component-incorporated circuit board
800U structural body-ground surface
811U terminal-ground surface
840 component
841 terminal portion
900 structural body
900U structural body-ground surface
910 cured layer
910U cured product-ground surface
920 connection terminal portion
920U terminal-ground surface
930 thin film layer
930H via hole
940 rewiring layer

DETAILED DESCRIPTION OF THE PREFERRED EMBODIMENTS

Hereinafter, the present invention will be explained in detail with reference to embodiments and examples. However, the present invention is not limited to the following embodiments and examples. The invention may be carried out with any modifications made to the extend not departing from the claims of the present invention and equivalents thereof 1. Outline of the Cured Product FIG. 1 is a sectional view schematically illustrating a cured product 100 as one embodiment of the present invention.

The cured product 100 illustrated in FIG. 1 as one embodiment of the present invention is formed of a cured material obtained by curing a resin composition comprising (A) an epoxy resin, (B) a curing agent, and (C) an inorganic filler. Usually, the cured product 100 is formed in a layered form as illustrated in FIG. 1. However, the cured product 100 is not limited to the layered form.

The cured product 100 has a ground surface 100U that is formed by grinding the cured product 100. When the cured product 100 is in the layered form, usually the ground surface 100U is formed in parallel to the layer's plane of the cured product 100 so that the ground surface is perpendicular to the thickness direction of the cured product 100.

Macroscopically, the ground surface 100U is a flat surface. However, microscopically, the ground surface 100U may include a depressed portion 110. In the cured product 100 according to this embodiment, a maximum depth D of the depressed portion 110 that is present on the ground surface 100U is within an particular range. The maximum depth D of the depressed portion 110 means the depth of the deepest depressed portion 110 among all the depressed portions 110 on the ground surface 100U. Specifically, the maximum depth D of the depressed portion 110 is usually less than 10 µm, and preferably less than 5 µm. When the maximum depth D of the depressed portion 110 on the ground surface 100U is within the particular range as mentioned above, a uniform applicability upon applying a resin onto the ground surface 100U can be improved. Accordingly, a uniform thin film layer can be formed on the ground surface 100U with suppressing formation of the defect so that a fine rewiring layer (not illustrated in FIG. 1) can be formed.

The maximum depth D of the depressed portion 110 on the ground surface 100U is ideally 0 µm. However, because the (C) inorganic filler is included, the maximum depth D is usually greater than 0 µm. The maximum depth D of the depressed portion 110 may be, for example, 0.6 µm or more, 1.0 µm or more, 1.5 µm or more, or 2.0 µm or more.

The maximum depth D of the depressed portion 110 on the ground surface 100U can be measured by the method described below.

The cured product 100 is scraped by means of a focused ion beam (FIB) so as to expose the section that is perpendicular to the ground surface 100U of the cured product 100. A photograph of the section thus exposed is taken by a scanning electron microscope (SEM) so as to obtain a SEM picture of the section (observation width of 60 µm and the observation magnification of 2,000). This observation of sections is carried out at 50 different places that are randomly selected. The fifty places are selected as measurement places at which the depressed portion 110 can be photographed. Then, from the SEM pictures of the sections thus obtained, the maximum depth of the depressed portions 110 is measured. The maximum depth is taken as the maximum depth D of the depressed portion 110.

Examples of the method for bringing the maximum depth D of the depressed portion 110 on the ground surface 100U into the range described above include:

a method with which a composition of the resin composition is controlled so as to suppress detachment of a particle of the (C) inorganic filler from the ground surface 100U, a method with which a particle diameter of the particle of the (C) inorganic filler is controlled such that even if the particle is detached from the ground surface 100U, a trace of the detachment thereof can be shallow, and a method with which a hollow portion formed inside the hollow filler particle included in the (C) inorganic filler is made smaller.

2. Resin Composition

The resin composition comprises, as described above, (A) an epoxy resin, (B) a curing agent, and (C) an inorganic filler. The resin composition may further include an optional component other than (A) the epoxy resin, (B) the curing agent, and (C) the inorganic filler.

2.1. (A) Epoxy Resin

The resin composition contains an epoxy resin as the (A) component. Examples of the (A) epoxy resin include a bixylenol type epoxy resin, a bisphenol A type epoxy resin, a bisphenol F type epoxy resin, a bisphenol S type epoxy resin, a bisphenol AF type epoxy resin, a dicyclopentadiene type epoxy resin, a trisphenol type epoxy resin, a naphthol novolak type epoxy resin, a phenol novolak type epoxy resin, a tert-butyl-catechol type epoxy resin, a naphthalene type epoxy resin, a naphthol type epoxy resin, an anthracene type epoxy resin, a glycidyl amine type epoxy resin, a glycidyl ester type epoxy resin, a cresol novolak type epoxy resin, a biphenyl type epoxy resin, a linear aliphatic type epoxy resin, an epoxy resin having a butadiene structure, an alicyclic epoxy resin, a heterocyclic epoxy resin, an spiro ring containing epoxy resin, a cyclohexane type epoxy resin, a cyclohexane dimethanol type epoxy resin, a naphthylene ether type epoxy resin, a trimethylol type epoxy resin, and a tetraphenylethane type epoxy resin. The epoxy resin may be used alone or in combination of two or more kinds thereof.

In view of lowering the average coefficient of linear thermal expansion of the cured product, the (A) epoxy resin is preferably an aromatic epoxy resin. The aromatic epoxy resin means an epoxy resin containing an aromatic skeleton in the molecule thereof. The aromatic skeleton means a chemical structure generally defined as an aromatic, and includes not only a single ring structure such as a benzene ring but also a polycyclic aromatic structure such as a naphthalene ring, and an aromatic heterocyclic structure. Among them, the (A) epoxy resin is preferably one or more epoxy resins selected from the group consisting of a bisphenol A type epoxy resin, a bisphenol F type epoxy resin, a naphthalene type epoxy resin, and a glycidyl amine type epoxy resin. When these epoxy resins are used, the effects, such as shallowing of the depth of the depressed portion on the ground surface, lowering of the dielectric loss tangent of the cured material obtained by curing the resin composition, and decreasing of the tensile modulus of elasticity of the cured material, can be remarkably obtained.

In view of enhancement of the heat resistance of the cured product, the (A) epoxy resin is preferably an epoxy resin containing a nitrogen atom in the molecule thereof. Among them, the (A) epoxy resin is preferably a glycidyl amine type epoxy resin. When this is used, the effects, such as shallowing of the depth of the depressed portion on the ground surface, lowering of the dielectric loss tangent of the cured material obtained by curing the resin composition, and decreasing of the tensile modulus of elasticity of the cured material, can be remarkably obtained.

Furthermore, the (A) epoxy resin is preferably an epoxy resin having flexibility. When the epoxy resin having flexibility is used, the modulus of the cured product can be effectively lowered.

It is preferable that the resin composition contains, as the (A) epoxy resin, an epoxy resin including two or more epoxy groups in one molecule thereof. In view of enhancement of a crosslinking density so as to obtain the ground surface having a reduced surface roughness, the ratio of the epoxy resin including two or more epoxy groups in one molecule thereof is preferably 50% by mass or more, more preferably 60% by mass or more, and especially preferably 70% by mass or more, on the basis of 100% by mass of the non-volatile component in the (A) epoxy resin.

The epoxy resin is classified into the epoxy resin that is in the liquid state at 20° C. (hereinafter, may be referred to as a "liquid epoxy resin") and the epoxy resin that is in the solid state at 20° C. (may be referred to as a "solid epoxy resin"). The resin composition may contain, as the (A) epoxy resin, only the liquid epoxy resin or only the solid epoxy resin. The resin composition preferably contains the liquid epoxy resin and the solid epoxy resin in combination. When the combination of the liquid epoxy resin and the solid epoxy resin is used as the (A) epoxy resin, flexibility of the resin composition layer and breaking strength of the cured material obtained by curing the resin composition can be enhanced.

As the liquid epoxy resin, the liquid epoxy resin including two or more epoxy groups in one molecule thereof is preferable. The aromatic liquid epoxy resin including two or more epoxy groups in one molecule thereof is more preferable.

The liquid epoxy resin is preferably a bisphenol A type epoxy resin, a bisphenol F type epoxy resin, a bisphenol AF type epoxy resin, a naphthalene type epoxy resin, a glycidyl ester type epoxy resin, a glycidyl amine type epoxy resin, a phenol novolak type epoxy resin, an alicyclic epoxy resin containing an ester skeleton, a cyclohexane type epoxy resin, a cyclohexane dimethanol type epoxy resin, a glycidyl amine type epoxy resin, and an epoxy resin having a butadiene structure. The liquid epoxy resin is more preferably a glycidyl amine type epoxy resin, a bisphenol A type epoxy resin, a bisphenol F type epoxy resin, and a naphthalene type epoxy resin.

Specific examples of the liquid epoxy resin include "HP4032", "HP4032D", and "HP4032SS" (naphthalene type epoxy resins) manufactured by DIC Corp.; "828US", "jER828US", "jER828EL", "825", and "Epikote 828EL" (bisphenol A type epoxy resins) manufactured by Mitsubishi Chemical Corp.; "jER807" and "1750" (bisphenol F type epoxy resins) manufactured by Mitsubishi Chemical Corp., "jER152" (a phenol novolak type epoxy resin) manufactured by Mitsubishi Chemical Corp., "630" and "630LSD" (glycidyl amine type epoxy resins) manufactured by Mitsubishi Chemical Corp.; "ZX1059" (mixture of a bisphenol A type epoxy resin and a bisphenol F type epoxy resin) manufactured by Nippon Steel & Sumikin Materials Co., Ltd.; "EX-721" (a glycidyl ester type epoxy resin) manufactured by Nagase ChemteX Corp.; "Celloxide 2021P" (an alicyclic epoxy resin containing an ester skeleton) manufactured by Daicel Corp., "PB-3600" (an epoxy resin having a butadiene structure) manufactured by Daicel Corp.; "ZX1658" and "ZX1658GS" (liquid 1,4-glycidyl cyclohexane type epoxy resins) manufactured by Nippon Steel & Sumikin Materials Co., Ltd.; and "YL7984" (a special bifunctional liquid epoxy resin having flexibility) manufactured by Mitsubishi Chemical Corp. These may be used alone or in combination of two or more kinds thereof.

As the solid epoxy resin, the solid epoxy resin including three or more epoxy groups in one molecule thereof is preferable. The aromatic solid epoxy resin including three or more epoxy groups in one molecule thereof is more preferable.

The solid epoxy resin is preferably a bixylenol type epoxy resin, a biphenyl aralkyl type epoxy resin, a naphthalene type epoxy resin, a naphthalene type tetrafunctional epoxy resin, a cresol novolak type epoxy resin, a dicyclopentadiene type epoxy resin, a trisphenol type epoxy resin, a naphthol type epoxy resin, a biphenyl type epoxy resin, a naphthylene ether type epoxy resin, an anthracene type epoxy resin, a bisphenol A type epoxy resin, a bisphenol AF type epoxy resin, and a tetraphenylethane type epoxy resin. The solid epoxy resin is more preferably a naphthalene type epoxy resin.

Specific examples of the solid epoxy resin include "HP4032H" (a naphthalene type epoxy resin) manufactured by DIC Corp.; "HP-4700" and "HP-4710" (naphthalene type tetrafunctional epoxy resins) manufactured by DIC Corp.; "N-690" (cresol novolak type epoxy resin) manufactured by DIC Corp., "N-695" (a cresol novolak type epoxy resin) manufactured by DIC Corp.; "HP-7200" (a dicyclopentadiene type epoxy resin) manufactured by DIC Corp.; "HP-7200HH", "HP-7200H", "EXA-7311", "EXA-7311-G3", "EXA-7311-G4", "EXA-7311-G4S", and "HP6000" (naphthylene ether type epoxy resins) manufactured by DIC Corp.; "EPPN-502H" (a trisphenol type epoxy resin) manufactured by Nippon Kayaku Co., Ltd.; "NC7000L" (a naphthol novolak type epoxy resin) manufactured by Nippon Kayaku Co., Ltd.; "NC3000H", "NC3000", "NC3000L", and "NC3100" (biphenyl aralkyl type epoxy resins) manufactured by Nippon Kayaku Co., Ltd.; "ESN475V" (a naphthol type epoxy resin) manufactured by Nippon Steel & Sumikin Materials Co., Ltd.; "ESN485" (a naphthol novolak type epoxy resin) manufactured by Nippon Steel & Sumikin Materials Co., Ltd.; "YX4000H", "YX4000", and "YL6121" (biphenyl type epoxy resins) manufactured by Mitsubishi Chemical Corp.; "YX4000HK" (a bixylenol type epoxy resin) manufactured by Mitsubishi Chemical Corp.; "YX8800" (an anthracene type epoxy resin) manufactured by Mitsubishi Chemical Corp.; "PG-100" and "CG-500" (bisphenol AF type epoxy resins) manufactured by Osaka Gas Chemicals Co., Ltd.; "YL7760" (a bisphenol AF type epoxy resin) manufactured by Mitsubishi Chemical Corp.; "YL7800" (a fluorene type epoxy resin) manufactured by Mitsubishi Chemical Corp.; "jER1010" (solid bisphenol A type epoxy resin) manufactured by Mitsubishi Chemical Corp.; and "jER1031S" (a tetraphenylethane type epoxy resin) manufactured by Mitsubishi Chemical Corp. These may be used alone or in combination of two or more kinds thereof.

The mass ratio of the liquid epoxy resin to the solid epoxy resin (the liquid epoxy resin:the solid epoxy resin) is preferably 1:0 to 1:15, more preferably 1:0.15 to 1:10, and especially preferably 1:0.2 to 1:8. The mass ratio of the liquid epoxy resin to the solid epoxy resin being in the above-mentioned range can achieve a suitable adhesion when the resin composition is used in the form of the resin sheet. In addition, when the resin composition is used in the form of the resin sheet, not only a sufficient flexibility can be obtained but also a handling property can be enhanced. Furthermore, the breaking strength of the cured material obtained by curing the resin composition can be effectively enhanced.

The epoxy equivalent weight of the (A) epoxy resin is preferably 50 to 5,000, more preferably 50 to 3,000, especially preferably 80 to 2,000, and far more preferably 110 to 1,000. When the epoxy equivalent weight of the (A) epoxy resin is within the above-mentioned range, the crosslinking density of the cured material obtained by curing the resin composition is sufficiently high so that the cured product having the low surface roughness can be obtained. The epoxy equivalent weight is the mass of the resin containing one equivalent of epoxy group. The epoxy equivalent weight can be measured in accordance with JIS K7236.

In view of remarkably obtaining the intended effects of the present invention, the weight-average molecular weight of the (A) epoxy resin is preferably 100 to 5,000, more preferably 250 to 3,000, and especially preferably 400 to 1,500. The weight-average molecular weight of the resin such as the epoxy resin is a polystyrene-equivalent weight average molecular weight measured by a gel permeation chromatography (GPC) method.

In view of obtaining the cured product having superior mechanical strength and insulation reliability, a content of the (A) epoxy resin in the resin composition is preferably 1% by mass or more, more preferably 3% by mass or more, and especially preferably 5% by mass or more, and is preferably 50% by mass or less, more preferably 40% by mass or less, and especially preferably 30% by mass or less, on the basis of 100% by mass of the non-volatile components in the resin composition.

2.2. (B) Curing Agent

The resin composition includes a curing agent as the (B) component. Usually, the (B) curing agent has a function to cure the resin composition by undergoing a reaction with the (A) epoxy resin. The (B) curing agent may be used alone or in combination of two or more kinds thereof at any ratio.

As the (B) curing agent, a compound capable of curing the resin composition by reacting with the epoxy resin can be used. Examples thereof include a phenol-based curing agent, an acid anhydride-based curing agent, an active ester-based curing agent, a cyanate ester-based curing agent, a benzoxiazine-based curing agent, and a carbodiimide-based curing agent. Among them, a phenol-based curing agent and an acid anhydride-based curing agent are preferable. When these curing agents are used, the effects, such as shallowing of the depth of the depressed portion on the ground surface, lowering of the dielectric loss tangent of the cured material obtained by curing the resin composition, and decreasing of the tensile modulus of elasticity of the cured material, can be remarkably obtained.

Examples of the phenol-based curing agent include a curing agent including, in one molecule, one or more, or preferably two or more of the hydroxy groups bonded to an aromatic ring (such as a benzene ring and a naphthalene ring). Among them, a compound including the hydroxy group bonded to the benzene ring is preferable. In view of the heat resistance and the water resistance, a phenol-based curing agent including a novolak structure is preferable. In view of adhesion, a nitrogen-containing phenol-based curing agent is preferable, and a phenol-based curing agent containing a triazine skeleton is more preferable. In view of highly satisfying the heat resistance, the water resistance, and the adhesion, a phenol novolak curing agent containing a triazine skeleton is especially preferable.

Specific examples of the phenol-based curing agent include "MEH-7700", "MEH-7810", "MEH-7851", and "MEH-8000H" manufactured by Meiwa Plastic Industries, Ltd.; "NHN", "CBN", and "GPH" manufactured by Nippon Kayaku Co., Ltd.; "SN-170", "SN-180", "SN-190", "SN- 475", "SN-485", "SN-495", "SN-495V", "SN-375", and "SN-395" manufactured by Nippon Steel & Sumikin Materials Co., Ltd.; "TD-2090", "TD-2090-60M", "LA-7052", "LA-7054", "LA-1356", "LA-3018", "LA-3018-50P", "EXB-9500", "HPC-9500", "KA-1160", "KA-1163", and "KA-1165" manufactured by DIC Corp.; and "GDP-6115L", "GDP-6115H", and "ELPC75" manufactured by Gun Ei Chemical Industry Co., Ltd.

Examples of the acid anhydride-based curing agent include a curing agent having one or more acid anhydride groups in one molecule thereof. Specific examples of the acid anhydride-based curing agent include phthalic acid anhydride, tetrahydrophthalic acid anhydride, hexahydrophthalic acid anhydride, methyl tetrahydrophthalic acid anhydride, methyl hexahydrophthalic acid anhydride, methyl nadic acid anhydride, hydrogenated methyl nadic acid anhydride, trialkyl tetrahydrophthalic acid anhydride, dodecenyl succinic acid anhydride, 5-(2,5-dioxotetrahydro-3-furanyl)-3-methyl-3-cyclohexene-1,2-dicarboxylic acid anhydride, trimellitic acid anhydride, pyromellitic acid anhydride, benzophenone tetracarboxylic acid dianhydride, biphenyl tetracarboxylic acid dianhydride, naphthalene tetracarboxylic acid dianhydride, oxydiphthalic acid dianhydride, 3,3'-4,4'-diphenylsulfone tetracarboxylic acid dianhydride, 1,3,3a,4,5,9b-hexahydro-5-(tetrahydro-2,5-dioxo-3-furanyl)-naphtho[1,2-C]furan-1,3-dione, ethylene glycol bis(anhydrotrimellitate), and a polymer type acid anhydride such as a styrene-maleic acid resin through copolymerization of styrene and maleic acid.

Examples of the active ester-based curing agent include curing agents including one or more active ester groups in one molecule thereof. Among them, compounds including two or more highly reactive ester groups in one molecule thereof, such as phenol esters, thiophenol esters, N-hydroxyamine esters, and esters of heterocyclic hydroxy compounds, are preferable as the active ester-based curing agent. The active ester curing agent is preferably the compound that is obtained by condensation reaction of a carboxylic acid compound and/or a thiocarboxylic acid compound with a hydroxy compound and/or a thiol compound. Especially, in view of enhancement of a heat resistance, an active ester-based curing agent obtained from a carboxylic acid compound and a hydroxy compound is preferable, and an active ester-based curing agent obtained from a carboxylic acid compound and a phenol compound and/or a naphthol compound is more preferable.

Examples of the carboxylic acid compound include benzoic acid, acetic acid, succinic acid, maleic acid, itaconic acid, phthalic acid, isophthalic acid, terephthalic acid, and pyromellitic acid.

Examples of the phenol compound or the naphthol compound include hydroquinone, resorcin, bisphenol A, bisphenol F, bisphenol S, phenolphthalin, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, dicyclopentadiene type diphenol compound, and phenol novolak. The "dicyclopentadiene type diphenol compound" refers to the diphenol compound obtained by condensation of one dicyclopentadiene molecule with two phenol molecules.

Specific examples of the preferable active ester-based curing agent include an active ester compound containing a dicyclopentadiene type diphenol structure, an active ester compound containing a naphthalene structure, an active ester compound containing an acetylated product of phenol novolak, and an active ester compound containing a benzoylated product of phenol novolak. Among them, an active ester compound containing a naphthalene structure and an active ester compound containing a dicyclopentadiene type diphenol structure are preferable. The "dicyclopentadiene type diphenol structure" means a divalent structure of phenylene-dicyclopentylene-phenylene.

Examples of the commercially available active ester-based curing agent include active ester compounds containing a dicyclopentadiene type diphenol structure, such as "EXB9451", "EXB9460", "EXB9460S", "HPC-8000", "HPC-8000H", "HPC-8000-65T", "HPC-8000H-65TM", "EXB-8000L" "EXB-8000L-65TM", and "EXB-8150-65T" (manufactured by DIC Corp.); active ester compounds containing a naphthalene structure, such as "EXB9416-70BK" (manufactured by DIC Corp.); active ester compounds containing an acetylated product of phenol novolak, such as "DC808" (manufactured by Mitsubishi Chemical Corp.); active ester compounds containing a benzoylated product of phenol novolak, such as "YLH1026" (manufactured by Mitsubishi Chemical Corp.); active ester-based curing agents as an acetylated product of phenol novolak, such as "DC808" (manufactured by Mitsubishi Chemical Corp.); and active ester-based curing agents as a benzoylated product of phenol novolak, such as "YLH1026" (manufactured by Mitsubishi Chemical Corp.), "YLH1030" (manufactured by Mitsubishi Chemical Corp.), and "YLH1048" (manufactured by Mitsubishi Chemical Corp.).

Examples of the cyanate ester-based curing agent include bifunctional cyanate resins such as bisphenol A dicyanate, polyphenol cyanate, oligo(3-methylene-1,5-phenylene cyanate), 4,4'-methylenebis(2,6-dimethylphenyl cyanate), 4,4'-ethylidenediphenyl dicyanate, hexafluorobisphenol A dicyanate, 2,2-bis(4-cyanate)phenylpropane, 1,1-bis(4-cyanatephenylmethane), bis(4-cyanate-3,5-dimethylphenyl) methane, 1,3-bis(4-cyanatephenyl-1-(methylethylidene)) benzene, bis(4-cyanatephenyl) thioether, and bis(4-cyanatephenyl) ether; polyfunctional cyanate resins derived from a phenol novolak, a cresol novolak, and the like; and a prepolymer in which these cyanate resins have been partially triazinated. Specific examples of the cyanate ester-based curing agent include "PT30" and "PT60" (both are phenol novolak type polyfunctional cyanate ester resins); "ULL-950S" (polyfunctional cyanate ester resin); "BA230" and "BA230S75" (prepolymers in which part or all of bisphenol A dicyanate is triazinated to form a trimer), manufactured by Lonza Japan Ltd.

Specific examples of the benzoxazine-based curing agent include "HFB2006M" manufactured by Showa Highpolymer Co., Ltd.; and "P-d" and "F-a" manufactured by Shikoku Chemicals Corp.

Specific examples of the carbodiimide-based curing agent include "V-03" and "V-07" manufactured by Nisshinbo Chemical, Inc.).

A content of the (B) curing agent in the resin composition is preferably 0.1% by mass or more, more preferably 0.5% by mass or more, and still more preferably 1% by mass or more, and is preferably 40% by mass or less, more preferably 30% by mass or less, and still more preferably 20% by mass or less, on the basis of 100% by mass of the nonvolatile components in the resin composition. When the content of the (B) curing agent is within the above-mentioned range, the effects, such as shallowing of the depth of the depressed portion on the ground surface, lowering of the dielectric loss tangent of the cured material obtained by curing the resin composition, and decreasing of the tensile modulus of elasticity of the cured material, can be remarkably obtained.

The number of reactive groups in the (B) curing agent is preferably 0.1 or more, more preferably 0.2 or more, and still more preferably 0.3 or more, and is preferably 1.5 or less, more preferably 1.2 or less, still more preferably 1.1 or less, and especially preferably 1.0 or less, relative to 1 as the number of the epoxy group in the (A) epoxy resin. "The number of the epoxy group in the (A) epoxy resin" means a value obtained by dividing the mass of the non-volatile components in each (A) epoxy resin present in the resin composition by respective epoxy equivalent weight and summing the calculated values for all the (A) epoxy resins. "The number of the reactive group in the (B) curing agent" means a value obtained by dividing the mass of the non-volatile components in each (B) curing agent present in the resin composition by respective reactive group equivalent weight and summing the calculated values for all the (B) curing agents. When the number of the reactive group in the (B) curing agent relative to 1 as the number of the epoxy group in the (A) epoxy resin is within the above-mentioned range, the effects, such as shallowing of the depth of the depressed portion on the ground surface, lowering of the dielectric loss tangent of the cured material obtained by curing the resin composition, and decreasing of the tensile modulus of elasticity of the cured material, can be remarkably obtained.

2.3. (C) Inorganic Filler

The resin composition includes an inorganic filler as the (C) component. When the (C) inorganic filler is used, the coefficient of linear thermal expansion of the cured material obtained by curing the resin composition can be lowered, and the warpage thereof can be suppressed. The (C) inorganic filler may be used alone or in combination of two or more kinds thereof at any ratio.

An inorganic compound is usually used as the material for the (C) inorganic filler. Examples of the material for the (C) inorganic filler include silica, alumina, glass, cordierite, silicon oxide, barium sulfate, barium carbonate, talc, clay, mica powder, zinc oxide, hydrotalcite, boehmite, aluminum hydroxide, magnesium hydroxide, calcium carbonate, magnesium carbonate, magnesium oxide, boron nitride, aluminum nitride, manganese nitride, aluminum borate, strontium carbonate, strontium titanate, calcium titanate, magnesium titanate, bismuth titanate, titanium oxide, zirconium oxide, barium titanate, barium titanate zirconate, barium zirconate, calcium zirconate, zirconium phosphate, and zirconium phosphate tungstate. Among them, silica and alumina are preferable, and silica is especially preferable. Examples of the silica include amorphous silica, fused silica, crystalline silica, synthesized silica, and hollow silica. Spherical silica is preferable as the silica. When these materials are used, the effects, such as shallowing of the depth of the depressed portion on the ground surface, lowering of the dielectric loss tangent of the cured material obtained by curing the resin composition, and decreasing of the tensile modulus of elasticity of the cured material, can be remarkably obtained.

Figure 2:
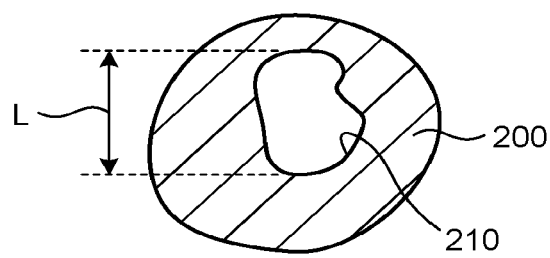
FIG. 2 is a sectional view schematically illustrating the hollow filler particle included in the (C) inorganic filler as one example.

FIG. 2 is a sectional view schematically illustrating a hollow filler particle 200 included in the (C) inorganic filler as one example.

The (C) inorganic filler usually includes the hollow filler particle 200 having a hollow portion 210 formed inside thereof, as illustrated in FIG. 2. When the resin composition is cured and ground, upon grinding of the hollow filler particle 200, the hollow portion 210 inside thereof may be opened to the ground surface thereby forming a depressed portion. Therefore, it is preferable to remove the hollow filler particle 200 from the (C) inorganic filler. However, the hollow filler particle 200 is generally formed inevitably at the time of production of the (C) inorganic filler. Thus it is difficult to completely remove the hollow filler particle 200 from the (C) inorganic filler.

On the other hand, it is possible to reduce the size of the hollow portion 210 of the hollow filler particle 200 included in the (C) inorganic filler. When the size of the hollow portion 210 is small, the depth of the depressed portion that is formed upon grinding of the hollow filler particle 200 can be shallow. Therefore, it is preferable to use the (C) inorganic filler that includes the hollow filler particle 200 having the small hollow portion 210. Specifically, it is preferable to use the (C) inorganic filler having the size of less than 5 µm at the largest as the long diameter L of the hollow portion 210 of the hollow filler particle 200 included in the (C) inorganic filler. In other words, the maximum value of the long diameter L of the hollow portion 210 of the hollow filler particle 200 included in the (C) inorganic filler is preferably less than 5 µm. The lower limit of the maximum value of the long diameter L of the hollow portion 210 of the hollow filler particle 200 is ideally 0 µm. However, the lower limit is usually more than 0 µm. The lower limit may be, for example, 0.6 µm or more, 1.0 µm or more, 1.5 µm or more, or 2.0 µm or more.

The long diameter L of the hollow portion 210 of the hollow filler particle 200 can be measured by the method described below.

The cured product of the resin composition including the hollow filler particle 200 is prepared. The cured product is scraped by means of FIB (focused ion beam) so as to cut the hollow filler particle 200. The exposed section is observed with SEM so that the long diameter L of the hollow portion 210 can be measured.

To control the raw material in production of the (C) inorganic filler may be an example of the method for reducing the size of the hollow portion 210 of the hollow filler particle 200 included in the (C) inorganic filler. To remove the hollow filler particle 200 having the large hollow portion 210 from the (C) inorganic filler by means of a classification treatment of the (C) inorganic filler using buoyancy may be another example of the method.

The average particle diameter of the (C) inorganic filler including the hollow filler particle 200 is preferably within an particular range. Specifically, the average particle diameter of the (C) inorganic filler is preferably 0.5 µm or more, more preferably 1.0 µm or more, still more preferably 2.0 µm or more, and especially preferably 2.5 µm or more, and is preferably 20 µm or less, more preferably 10 µm or less, still more preferably 8.0 µm or less, and especially preferably 5.0 µm or less. Generally, when the particle size of the (C) inorganic filler is small, the particles thereof tend to readily aggregate thereby forming a large secondary particle. It is presumed, however, that when the average particle diameter of the (C) inorganic filler is equal to or more than the lower limit of the above-mentioned range, generation of the secondary particle due to aggregation can be suppressed; and thus, generation of a large detachment trace due to detachment of the secondary particle from the ground surface can be suppressed. When the average particle diameter of the (C) inorganic filler is equal to or less than the upper limit of the above-mentioned range, generation of a large detachment trace due to detachment of the particle of the (C) inorganic filler from the ground surface can be suppressed. Accordingly, when the average particle diameter of the (C)

inorganic filler is within the above-mentioned range, the depth of the depressed portion formed on the ground surface can be shallow.

The average particle diameter of the particles such as the (C) inorganic filler can be measured with a laser diffraction and scattering method based on the Mie scattering theory. Specifically, the particle diameter distribution of the particles is obtained on the basis of volume by means of a laser diffraction scattering type particle diameter distribution measurement apparatus, and the average particle diameter thereof can be measured as the median diameter from the particle diameter distribution. The measurement sample obtained by dispersing the particles into a solvent such as water by means of an ultrasonic wave can be preferably used. Examples of the laser diffraction scattering type particle diameter distribution measurement apparatus include "LA-500" manufactured by Horiba Ltd.

The maximum particle diameter of the (C) inorganic filler is preferably less than 15 μm, and more preferably less than 10 μm. When the maximum particle diameter of the (C) inorganic filler is within the above-mentioned range, generation of a large detachment trace due to detachment of the particle of the (C) inorganic filler from the ground surface can be suppressed so that the depth of the depressed portion formed on the ground surface can be shallow. The lower limit of the maximum particle diameter of the (C) inorganic filler may be, for example, 1 μm. The (C) inorganic filler having the aforementioned maximum particle diameter can be obtained by removing large particles by classification.

Specific surface area of the (C) inorganic filler is preferably 0.1 $m^2/g$ or more, more preferably 0.5 $m^2/g$ or more, and especially preferably 1.0 $m^2/g$ or more, and is preferably 60 $m^2/g$ or less, more preferably 50 $m^2/g$ or less, and especially preferably 40 $m^2/g$ or less. When the specific surface area of the (C) inorganic filler is within the above-mentioned range, the depth of the depressed portion formed on the ground surface can be readily shallow. The specific surface area of the (C) inorganic filler can be measured with a BET method.

It is preferable that the (C) inorganic filler has been subjected to a surface treatment with a suitable surface treatment agent. The surface treatment can suppress aggregation of the particles of the (C) inorganic filler and detachment of the particle of the (C) inorganic filler from the ground surface. Thus the depth of the depressed portion formed on the ground surface can be shallow. Usually, the surface treatment can enhance humidity resistance and dispersion property of the (C) inorganic filler.

As the surface treatment agent, a silane compound is preferable, and an amino silane compound and an epoxy silane compound are especially preferable.

A silane compound including an amino group can be used as the amino silane compound. Especially, an amino silane-based coupling agent is preferable. Examples of the amino silane compound include "KBM-903" (3-aminopropyl trimethoxy silane), "KBE-903" (3-aminopropyl triethoxy silane), "KBM-573" (N-phenyl-3-aminopropyl trimethoxy silane), "KBM-602" (N-2-(aminoethyl)-3-aminopropyl methyl dimethoxy silane), "KBM-603" (N-2-(aminoethyl)-3-aminopropyl trimethoxy silane), and "KBM-6803" (N-2-(aminoethyl)-8-aminooctyl trimethoxy silane) manufactured by Shin-Etsu Chemical Co., Ld.

A silane compound including an epoxy group can be used as the epoxy silane compound. Especially, an epoxy silane-based coupling agent is preferable. Examples of the epoxy silane compound include "X-12-1231" (3-(2-glycidylphenyl)propyl trimethoxy silane), "KBM-403" (3-glycidoxypropyl trimethoxy silane), "KBM-303" (2-(3,4-epoxycyclohexyl)ethyl trimethoxy silane), "KBM-402" (3-glycidoxypropyl methyl dimethoxy silane), "KBE-403" (3-glycidoxypropyl triethoxy silane), "KBE-402" (3-glycidoxypropyl methyl diethoxy silane), and "KBM-4803" (8-glycidoxyoctyl trimethoxy silane) manufactured by Shin-Etsu Chemical Co., Ld.

The surface treatment agent may be used alone or in combination of two or more kinds thereof at any ratio.

The degree of the surface treatment with the surface treatment agent can be evaluated by a carbon amount per unit surface area of the (C) inorganic filler. In view of enhancement of the dispersion property of the (C) inorganic filler, the carbon amount per unit surface area of the (C) inorganic filler is preferably 0.02 $mg/m^2$ or more, more preferably 0.1 $mg/m^2$ or more, and especially preferably 0.2 $mg/m^2$ or more. In view of suppressing an increase in the melt viscosity of the resin composition and in the melt viscosity in the sheet form, the carbon amount is preferably 1 $mg/m^2$ or less, more preferably 0.8 $mg/m^2$ or less, and especially preferably 0.5 $mg/m^2$ or less.

The carbon amount per unit surface area of the (C) inorganic filler can be measured after the surface-treated (C) inorganic filler is cleaned by a solvent (for example, methyl ethyl ketone (hereinafter, may be simply called "MEK")). Specifically, a sufficient amount of methyl ethyl ketone is mixed with the (C) inorganic filler whose surface has been treated with a surface treatment agent and the resulting mixture is cleaned by means of an ultrasonic wave at 25° C. for 5 minutes. Then, a supernatant solution is removed and a solid component is dried. The carbon amount per unit surface area of the (C) inorganic filler can be measured using a carbon analysis apparatus. For the carbon analysis apparatus, "EMIA-320V" manufactured by Horiba Ltd. can be used.

A content of the (C) inorganic filler in the resin composition is preferably 40% by mass or more, more preferably 50% by mass or more, and still more preferably 60% by mass or more, and is preferably 95% by mass or less, more preferably 92% by mass or less, and still more preferably 90% by mass or less, on the basis of 100% by mass of the non-volatile components in the resin composition. When a content of the (C) inorganic filler is within the above-mentioned range, the effects, such as shallowing of the depth of the depressed portion on the ground surface, lowering of the dielectric loss tangent of the cured material obtained by curing the resin composition, and decreasing of the tensile modulus of elasticity of the cured material, can be remarkably obtained.

2.4. (D) Curing Accelerator

The resin composition may contain, besides the components described above, (D) a curing accelerator as an optional component. The (D) curing accelerator can facilitate curing when the resin composition is cured.

Examples of the curing accelerator as the (D) component include a phosphorus-based curing accelerator, an amine-based curing accelerator, an imidazole-based curing accelerator, a guanidine-based curing accelerator, and a metal-based curing accelerator. A phosphorus-based curing accelerator, an amine-based curing accelerator, an imidazole-based curing accelerator, and a metal-based curing accelerator are preferable. Among them, an amine-based curing accelerator, an imidazole-based curing accelerator, and a metal-based curing accelerator are preferable, and an imidazole-based curing accelerator is especially preferable. When these accelerators are used, usually the effects, such as shallowing of the depth of the depressed portion on the ground surface, lowering of the dielectric loss tangent of the cured material obtained by curing the resin composition, and decreasing of the tensile modulus of elasticity of the cured material, can be remarkably obtained. The curing accelerator may be used alone or in combination of two or more kinds thereof.

Examples of the phosphorus-based curing accelerator include triphenyl phosphine, a phosphonium borate compound, tetraphenyl phosphonium tetraphenyl borate, n-butyl phosphonium tetraphenyl borate, tetrabutyl phosphonium decanoate salts, (4-methylphenyl)triphenyl phosphonium thiocyanate, tetraphenyl phosphonium thiocyanate, and butyl triphenyl phosphonium thiocyanate. Among them, triphenyl phosphine and tetrabutyl phosphonium decanoate salts are preferable.

Examples of the amine-based curing accelerator include trialkyl amine such as triethyl amine and tributyl amine, 4-dimethylaminopyridine, benzyl dimethyl amine, 2,4,6-tris (dimethylaminomethyl)phenol, and 1,8-diazabicyclo(5,4,0)-undecene. Among them, 4-dimethylaminopyridine and 1,8-diazabicyclo(5,4,0)-undecene are preferable.

Examples of the imidazole-based curing accelerator include imidazole compound such as 2-methyl imidazole, 2-undecyl imidazole, 2-heptadecyl imidazole, 1,2-dimethyl imidazole, 2-ethyl-4-methyl imidazole, 2-phenyl imidazole, 2-phenyl-4-methyl imidazole, 1-benzyl-2-methyl imidazole, 1-benzyl-2-phenyl imidazole, 1-cyanoethyl-2-methyl imidazole, 1-cyanoethyl-2-undecyl imidazole, 1-cyanoethyl-2-ethyl-4-methyl imidazole, 1-cyanoethyl-2-phenyl imidazole, 1-cyanoethyl-2-undecyl imidazolium trimellitate, 1-cyanoethyl-2-phenyl imidazolium trimellitate, 2,4-diamino-6-[2'-methylimidazolyl-(1')]-ethyl-s-triazine, 2,4-diamino-6-[2'-undecyl imidazolyl-(1')]-ethyl-s-triazine, 2,4-diamino-6-[2'-ethyl-4'-methylimidazolyl-(1)]-ethyl-s-triazine, a 2,4-diamino-6-[2'-methylimidazolyl-(1')]-ethyl-s-triazine isocyanuric acid adduct, a 2-phenylimidazole isocyanuric acid adduct, 2-phenyl-4,5-dihydroxymethyl imidazole, 2-phenyl-4-methyl-5-hydroxymethyl imidazole, 2,3-dihydro-1H-pyrrolo[1,2-a]benzimidazole, 1-dodecyl-2-methyl-3-benzyl imidazolium chloride, 2-methyl imidazoline, and 2-phenyl imidazoline; and an adduct of such imidazole compound and an epoxy resin. Among them, 2-ethyl-4-methyl imidazole and 1-benzyl-2-phenyl imidazole are preferable.

Commercially available imidazole-based curing accelerators may be used. Examples thereof include "P200-H50" manufactured by Mitsubishi Chemical Corp. and "1B2PZ" manufactured by Shikoku Chemicals Corp.

Examples of the guanidine-based curing accelerator include dicyan diamide, 1-methyl guanidine, 1-ethyl guanidine, 1-cyclohexyl guanidine, 1-phenyl guanidine, 1-(o-tolyl) guanidine, dimethyl guanidine, diphenyl guanidine, trimethyl guanidine, tetramethyl guanidine, pentamethyl guanidine, 1,5,7-triazabicyclo[4.4.0]dec-5-ene, 7-methyl-1,5,7-triazabicyclo[4.4.0]dec-5-ene, 1-methyl biguanide, 1-ethyl biguanide, 1-n-butyl biguanide, 1-n-octadecyl biguanide, 1,1-dimethyl biguanide, 1,1-diethyl biguanide, 1-cyclohexyl biguanide, 1-allyl biguanide, 1-phenyl biguanide, and 1-(o-tolyl) biguanide. Among them, dicyan diamide and 1,5,7-triazabicyclo[4.4.0]dec-5-ene are preferable.

Examples of the metal-based curing accelerator include an organometallic complex or an organometallic salt of an metal such as cobalt, copper, zinc, iron, nickel, manganese, and tin. Specific examples of the organometallic complex include an organic cobalt complex such as cobalt (II) acetylacetonate and cobalt (III) acetylacetonate, an organic copper complex such as copper (II) acetylacetonate, an organic zinc complex such as zinc (II) acetylacetonate, an organic iron complex such as iron (III) acetylacetonate, an organic nickel complex such as nickel (IT) acetylacetonate, and an organic manganese complex such as manganese (II) acetylacetonate. Examples of the organometallic salt include zinc octylate, tin octylate, zinc naphthenate, cobalt naphthenate, tin stearate, and zinc stearate.

When the resin composition includes the (D) curing accelerator, a content of the (D) curing accelerator is preferably 0.01% by mass or more, more preferably 0.03% by mass or more, and especially preferably 0.05% by mass or more, and is preferably 3% by mass or less, more preferably 1.5% by mass or less, and especially preferably 1% by mass or less, on the basis of 100% by mass of the non-volatile components in the resin composition. When the content of the (D) curing accelerator is within the above-mentioned range, curing of the resin composition can be effectively facilitated. In addition, when the content of the (D) curing accelerator is within the above-mentioned range, usually the effects, such as shallowing of the depth of the depressed portion on the ground surface, lowering of the dielectric loss tangent of the cured material obtained by curing the resin composition, and decreasing of the tensile modulus of elasticity of the cured material, can be remarkably obtained.

2.5. (E) Organic Filler

The resin composition may include, in addition to the components mentioned above, (E) an organic filler as an optional component. When the (E) organic filler is used, mechanical characteristics such as tensile modulus of elasticity of the cured material obtained by curing the resin composition can be readily controlled within a suitable range.

The organic filler as the (E) component is preferably a rubber particle. The rubber particle that is insoluble in an organic solvent to be used for preparation of a resin varnish and is incompatible with the (A) to (C) components can be used. Generally, the rubber particle as mentioned above may be prepared by increasing the molecular weight of a component in the rubber particle until the component is hardly dissolved into the organic solvent and the resin so as to make the component a particle state.

Examples of the rubber particle include a core-shell type rubber particle, a crosslinked acrylonitrile butadiene rubber particle, a crosslinked styrene butadiene rubber particle, and an acrylic rubber particle. The core-shell type rubber particle is the rubber particle comprising a core layer and a shell layer. Examples of the core-shell type rubber particle include a rubber particle having a bilayer structure in which the shell layer, i.e., the outer layer, is formed of a glassy polymer and the core layer, i.e., the inner layer, is formed of a rubbery polymer; and a rubber particle having a three-layer structure in which the shell layer, i.e., the outer layer, is formed of a glassy polymer, the intermediate layer is formed of a rubbery polymer, and the core layer, i.e., the inner layer, is formed of a glassy polymer. The glassy polymer layer is formed of, for example, a methyl methacrylate polymer. The rubbery polymer layer is formed of, for example, a butyl acrylate polymer (butyl rubber). Examples of the rubber particle include "Stafiloid IM-401" manufactured by Ganz Chemical Co., Ltd. The (E) organic fillers such as the rubber particle may be used alone or in combination of two or more kinds thereof at any ratio.

The average particle diameter of the (E) organic filler is preferably in the range of 0.005 μm to 1 μm, and more preferably in the range of 0.2 μm to 0.6 μm. The average particle diameter of the (E) organic filler can be measured with the same method as the measurement method of the average particle diameter of the (C) inorganic filler.

When the resin composition includes the (E) organic filler, the content of the (E) organic filler is preferably 0.1% by mass or more, more preferably 0.2% by mass or more, still more preferably 0.3% by mass or more, and especially preferably 0.5% by mass or more, and is preferably 20% by mass or less, more preferably 10% by mass or less, still more preferably 5% by mass or less, and especially preferably 3% by mass or less, on the basis of 100% by mass of the non-volatile components in the resin composition. When the content of the (E) organic filler is within the above-mentioned range, the mechanical characteristics of the cured material obtained by curing the resin composition can be readily controlled within the suitable range. In addition, when the content of the (E) organic filler is within the above-mentioned range, usually, the effects, such as shallowing of the depth of the depressed portion on the ground surface, lowering of the dielectric loss tangent of the cured material obtained by curing the resin composition, and decreasing of the tensile modulus of elasticity of the cured material, can be remarkably obtained.

2.6. (F) Colorant

The resin composition may include, in addition to the components mentioned above, (F) a colorant as an optional component. When the (F) colorant is used, the resin composition and the cured material thereof can be colored with the color of the (F) colorant.

The (F) colorant to be used may be a pigment or a dye, or a combination of them. In particular, the (F) colorant is preferably a pigment. The pigment has a high coloring property so that it can effectively color the resin composition and the cured material thereof.

Examples of the pigment are as follows. Namely, examples of the blue pigment include a phthalocyanine-based pigment, an anthraquinone-based pigment, and a dioxazine-based pigment. Examples of the yellow pigment include a monoazo-based pigment, a disazo-based pigment, a condensed azo-based pigment, a benzimidazolone-based pigment, an isoindolinone-based pigment, and an anthraquinone-based pigment. Examples of the red pigment include a monoazo-based pigment, a disazo-based pigment, an azo lake-based pigment, a benzimidazolone-based pigment, a perylene-based pigment, a diketopyrrolo pyrrole-based pigment, a condensed azo-based pigment, an anthraquinone-based pigment, and a quinacridone-based pigment. Examples of the black pigment include carbon black and graphite. Examples of the green pigment include a phthalocyanine-based pigment.

Usually, in the resin composition, the pigment is not dissolved in the (A) epoxy resin so that the pigment exists as particles. The average particle diameter of the particles of the pigment is preferably 5 nm or more, more preferably 10 nm or more, and especially preferably 15 nm or more, and is preferably 300 nm or less, more preferably 100 nm or less, and especially preferably 50 nm or less. When the pigment having a small average particle diameter is used, the color of the resin composition and of the cured product thereof can be readily controlled.

The (F) colorant may be used alone or in combination of two or more kinds thereof at any ratio.

When the resin composition includes the (F) colorant, a content of the (F) colorant is preferably 0.1% by mass or more, more preferably 0.2% by mass or more, and especially preferably 0.3% by mass or more, and is preferably 5% by mass or less, more preferably 4% by mass or less, and especially preferably 3% by mass or less, on the basis of 100% by mass of the non-volatile components in the resin composition.

2.7. (G) Optional Components

The resin composition may further include, in addition to the components mentioned above, other additives as optional components. Examples of the additive include a resin additive such as an organometallic compound including an organic copper compound, an organic zinc compound, and an organic cobalt compound; a thermoplastic resin; a thickener; an antifoaming agent; a leveling agent; an adhesion-imparting agent; and a flame retardant. The additive may be used alone or in combination of two or more kinds thereof at any ratio.

2.8. State of the Resin Composition

The resin composition may be in a liquid state or in a solid state.

For example, the resin composition in a liquid state at normal temperature (for example, 20° C.) can be shaped at normal temperature without any special temperature control. Therefore, the resin composition can be used for production of the cured product by means of a shaping method such as a lamination method and a compression molding method at normal temperature. The resin composition may be shaped with heating to a suitable temperature.

For example, the resin composition in a solid state at normal temperature can usually have a liquid state when the temperature thereof is controlled to a higher temperature (for example, 130° C.). Therefore, when proper temperature control such as heating is carried out, the resin composition can be used for production of the cured product by means of a shaping method such as a lamination method and a compression molding method.

2.9. Characteristics of the Cured Material of the Resin Composition

When the cured material obtained by curing the resin composition is ground, the ground surface having a reduced maximum depth of the depressed portion can be obtained. Specifically, in the case when the evaluation test in which the cured product for evaluation that is obtained by curing the resin composition at 180° C. for 1 hour is ground to form the ground surface for evaluation having an arithmetic average roughness Ra of 500 nm or less is carried out, the maximum depth D of the depressed portion present on this ground surface for evaluation can be within the particular range as mentioned above. The terms "the cured product for evaluation" and "the ground surface for evaluation" are used in order to distinguish the cured product and the ground surface to be used for evaluation of the resin composition from the cured product and the ground surface to be used for other purposes than for evaluation. Therefore, when this resin composition is used, the cured product having the ground surface with a reduced maximum depth D of the depressed portion can be formed. Accordingly, when this resin composition is used, the cured product having the ground surface with a superior uniform applicability of a resin can be obtained.

Hereinafter, with regard to the depressed portion that may be formed on the ground surface, the way how to reduce the maximum depth D thereof will be explained. However, the technical scope of the present invention is not restricted by the way to be explained hereinafter.

Figure 3:
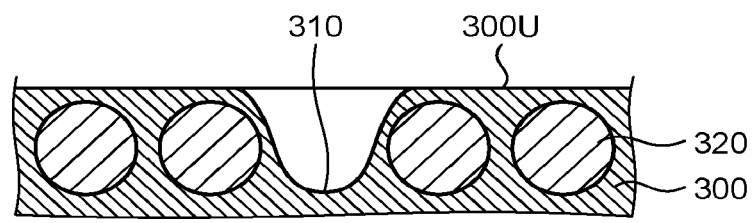
FIG. 3 is an enlarged sectional view schematically illustrating a neighboring part of the depressed portion on the ground surface of the cured product obtained by using the resin composition as one example.

FIG. 3 is an enlarged sectional view schematically illustrating a neighboring part of a depressed portion 310 on a ground surface 300U of a cured product 300 obtained by using the resin composition as one example.

As illustrated in FIG. 3, when a particle 320 of the (C) inorganic filler included in the cured product 300 is detached, the depressed portion 310 may be formed on the ground surface 300U. The depth of the depressed portion 310 of this type can be reduced when the particle diameter of the particle 320 is small. It may be presumed that a secondary particle formed by aggregation of a plurality of the particles 320 (not illustrated in the figure) is detached. In this case, such aggregation can be suppressed by appropriately controlling the particle diameter of the particle 320. Therefore, the depressed portion 310 formed by detachment of the particle 320 of the (C) inorganic filler can have the depth thereof reduced to less than 10 μm by appropriately controlling the average particle diameter of the (C) inorganic filler. Furthermore, when the resin components included in the resin composition are properly controlled, or when the (C) inorganic filler has been subjected to the surface treatment, detachment of the particle 320 itself can be suppressed. As a result, the maximum depth D of the depressed portion 310 on the ground surface 300U can be within the particular range as mentioned above. The "resin components" means, among the non-volatile components included in the resin composition, the components other than the (C) inorganic filler.

Figure 4:
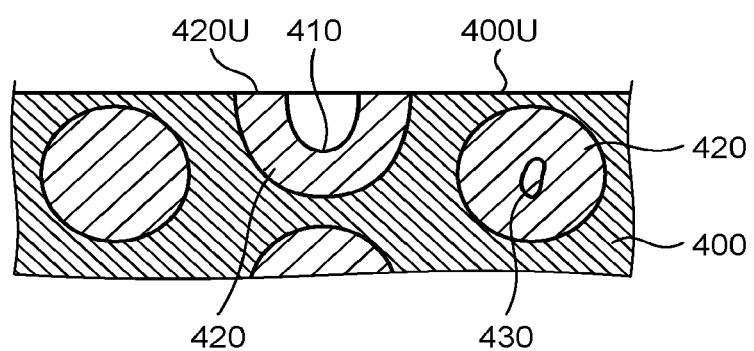
FIG. 4 is an enlarged sectional view schematically illustrating a neighboring part of the depressed portion on the ground surface of the cured product obtained by using the resin composition as one example.

FIG. 4 is an enlarged sectional view schematically illustrating a neighboring part of a depressed portion 410 on a ground surface 400U of a cured product 400 obtained by using the resin composition as one example.

As illustrated in FIG. 4, when a hollow filler particle 420 as a particle included in the (C) inorganic filler is ground at the time of grinding the cured product 400 to open a hollow portion 430 of the hollow filler particle 420 to the ground surface 400U, the depressed portion 410 on the ground surface 400U may be formed. The ground surface 400U having the depressed portion 410 thus formed usually includes a filler surface part 420U formed by grinding of the (C) inorganic filler such as the hollow filler particle 420. The depressed portion 410 is formed on the filler surface part 420U. The depth of the depressed portion 410 of this type can be reduced when the hollow portion 430 of the hollow filler particle 420 included in the (C) inorganic filler is small. In general, the shapes of the hollow portions 430 are not uniform. However, when the long diameter of the hollow portion 430 is sufficiently small, the depth of the depressed portion 410 can be reduced even if the hollow portion 430 is opened to the ground surface 400U. Therefore, when the long diameter of the hollow portion of the hollow filler particle 420 is small, the depth of the depressed portion 410 formed by grinding of the hollow filler particle 420 in the (C) inorganic filler can be reduced to less than 10 μm. As a result, the maximum depth D of the depressed portion 410 on the ground surface 400U can be within the particular range as mentioned above. The cured product 400 having the filler surface part 420U where the depressed portion 410 is formed usually includes the hollow filler particle 420 in the cured product 400. Accordingly, when the cured product 400 is cut and the section thereof is observed, the hollow filler particle 420 can be usually observed in the position other than the ground surface 400U in the cured product 400.

Usually, the cured material obtained by curing the resin composition has a low dielectric loss tangent. Therefore, the cured product formed of this cured material can be used as an insulating layer having a low dielectric loss tangent.

For example, the cured material is produced by curing the resin composition in accordance with the method described in Examples. The dielectric loss tangent of the cured material measured with the measurement method described in Examples is preferably 0.010 or less, and more preferably 0.008 or less. The lower limit value of the dielectric loss tangent is better as it is lower. The lower limit value may be, for example, 0.001 or more.

Usually, the cured material obtained by curing the resin composition has a tensile modulus of elasticity in the range suitable for an insulating layer. For example, the cured material is produced by curing the resin composition in accordance with the method described in Examples. The tensile modulus of elasticity of this cured material measured with the measurement method described in Examples is preferably 5 GPa or more, more preferably 8 GPa or more, and still more preferably 10 GPa or more, and is preferably 20 GPa or less, more preferably 18 GPa or less, and still more preferably 17 GPa or less.

3. Characteristics of the Cured Product

The cured product is formed of the cured material obtained by curing the resin composition. This cured product has at least one ground surface. Usually, the ground surface is a flat surface that is flush except for the depressed portion. Here, a certain surface is "flush" means that this surface is in the same plane.

In view of enabling to obtain uniform applicability of a resin onto the ground surface, the surface roughness of the ground surface of the cured product is preferably low. Specifically, the arithmetic average roughness Ra of the ground surface is preferably 500 nm or less, more preferably 300 nm or less, and especially preferably 100 nm or less. The lower limit of the arithmetic average roughness Ra of the ground surface is not particularly restricted. The lower limit may be, for example, 10 nm or more, or 20 nm or more.

The arithmetic average roughness Ra of the ground surface can be measured with the method described in Examples.

The ground surface of the cured product does not have the depressed portion having the depth of 10 μm or more, as mentioned above. Therefore, the resin such as a photoresist can be uniformly applied onto the ground surface. For example, the resin is applied by means of spin coating with the conditions described in Examples onto a circular ground surface having a diameter of 4 inches to form a thin film layer. At this time, generation of the defect in the thin film layer to be formed can be suppressed. Because the thin film layer can be uniformly formed, a fine rewiring layer can be formed on the ground surface via this thin film layer.

The cured product is formed of the cured material obtained by curing the resin composition described above. Thus, usually, the cured product has superior dielectric loss tangent and tensile modulus of elasticity as mentioned above.

There is no restriction in the form of the cured product. The cured product is usually formed in the form of a layer. Usually, the ground surface of the cured product in the form of a layer is a plane parallel to the layer's plane of the layer of the cured product. The thickness of the cured product in the form of a layer is, in view of thinning, preferably 700 μm or less, more preferably 650 μm or less, and still more preferably 620 μm or less. The lower limit of the thickness is not particularly restricted. The lower limit may be, for example, 10 μm or more.

4. Method for Producing the Cured Product

Usually, the cured product can be produced by curing the resin composition followed by grinding thereof. The cured product especially in the form of a layer can be produced, for example, by a production method including the following steps (1) to (3):

(1) forming a resin composition layer of the resin composition;
(2) curing the resin composition to obtain the cured product; and
(3) grinding the cured product.

In the step (1), usually, a substrate is prepared, and the resin composition layer is formed on this substrate. Examples of the substrate include a board such as a glass epoxy substrate, a metal substrate (such as a stainless steel and a cold roll steel plate (SPCC)), a silicon wafer, a glass wafer, a polyester substrate, a polyimide substrate, a BT resin substrate, and a thermosetting polyphenylene ether substrate. The substrate may include, inside thereof or on the surface thereof, a wiring layer or a component.

The resin composition layer may be formed, for example, by laminating a resin sheet and the substrate. The resin sheet is a member comprising a support and a resin composition layer formed on the support. The lamination can be carried out by, for example, thermal pressing the resin sheet to the substrate from the support side so as to bond the resin composition layer to the substrate. Examples of the member for thermal pressing of the resin sheet to the substrate (hereinafter may be referred to as a "thermal pressing member") include a heated metal plate (such as a SUS mirror plate) and a heated metal roll (such as a SUS roll). At this time, it is preferable that the resin sheet not be pressed directly with the thermal pressing member but be pressed via an elastic material such as a heat-resistant rubber so that the resin sheet sufficiently follows the irregularity on the surface of the substrate.

The lamination of the resin sheet and the substrate may be carried out, for example, by a vacuum lamination method. In the vacuum lamination method, the temperature of thermal pressing is preferably in the range of 60° C. to 160° C., and more preferably in the range of 80° C. to 140° C. The pressure of thermal pressing is preferably in the range of 0.098 MPa to 1.77 MPa, and more preferably in the range of 0.29 MPa to 1.47 MPa. The time of thermal pressing is preferably in the range of 20 seconds to 400 seconds, and more preferably in the range of 30 seconds to 300 seconds. It is preferable that the lamination is carried out under a reduced pressure condition of 13 hPa or less.

After the lamination, the laminated resin sheet may be subjected to a smoothing treatment, for example, by pressing the thermal pressing member from the support side under a normal pressure (under an atmospheric pressure). The pressing conditions of the smoothing treatment can be as same as the thermal pressing conditions for the lamination described above. The lamination and the smoothing treatment may be carried out continuously using a vacuum laminator.

Alternatively, the resin composition layer may be formed, for example, by a compression molding method. In the compression molding method, usually, the substrate and the resin composition are placed in a mold; and pressure, and heat if necessary, is applied to the resin composition in the mold to form the resin composition layer on the substrate.

The temperature of the mold during the compression molding is preferably the temperature at which the resin composition can express a superior compression moldability. The temperature of the mold is preferably 80° C. or higher, more preferably 100° C. or higher, and especially preferably 120° C. or higher, and is preferably 200° C. or lower, more preferably 170° C. or lower, and especially preferably 150° C. or lower. The pressure applied during the molding is preferably 1 MPa or more, more preferably 3 MPa or more, and especially preferably 5 MPa or more, and is preferably 50 MPa or lower, more preferably 30 MPa or lower, and especially preferably 20 MPa or lower. The curing time is preferably 1 minute or longer, more preferably 2 minutes or longer, and especially preferably 5 minutes or longer, and is preferably 60 minutes or shorter, more preferably 30 minutes or shorter, and especially preferably 20 minutes or shorter. Usually, after forming of the resin composition layer, the mold is removed. Removal of the mold may be carried out before or after thermal curing of the resin composition layer.

In the step (2), after the resin composition layer is formed on the substrate, the resin composition is cured to form the cured product. Usually, the resin composition layer is heated to be thermally cured. The curing condition is different depending on the kind of the resin composition. The curing temperature is usually 120° C. to 240° C., preferably 150° C. to 220° C., and more preferably 170° C. to 200° C. The curing time is usually 5 minutes to 120 minutes, preferably 10 minutes to 100 minutes, and more preferably 15 minutes to 90 minutes.

Before the resin composition is thermally cured, the resin composition layer may be pre-heated at the temperature lower than the curing temperature. The pre-heating condition is, for example, as follows. The temperature condition is usually 50° C. or higher and lower than 120° C., preferably 60° C. or higher and 110° C. or lower, and more preferably 70° C. or higher and 100° C. or lower. The heating time is usually 5 minutes or longer, preferably 5 minutes to 150 minutes, and more preferably 15 minutes to 120 minutes.

In the step (3), after the cured product is obtained, the cured product is ground to form the ground surface. A grinding method with which the ground surface having an intended surface roughness can be obtained can be employed. Examples of the grinding method include a chemical mechanical polishing method using a chemical mechanical polishing apparatus, a mechanical grinding method using a buff or the like, and a plane grinding method using rotation of a whetstone.

The method for producing the cured product may include a step of removing the substrate.

5. Use of the Cured Product

The cured product may be used as a sealing layer and an insulating layer by utilizing the merits as mentioned above. The cured product may be used, for example, as the insulating layer of a semiconductor chip package and as the insulating layer of a circuit board such as a printed wiring board. The cured product may be used, for example, as the sealing layer of a semiconductor chip. By utilizing the property that the resin composition can be a liquid state at an appropriate temperature by controlling the composition even when the resin composition does not contain solvent, the resin composition may be used as a liquid sealing material when the cured product is used as the sealing layer. The cured product may be used, for example, as the material for MUF (Molding Under Filling) that is used after a semiconductor chip is connected to a substrate. The cured product may be used, for example, as a solder resist, a die bonding material, a hole-filling resin, and a resin for embedding components.

Especially, it is preferable that the cured product is used for forming a rewiring layer on the ground surface by utilizing the merit that the ground surface does not have a large depressed portion as mentioned above. It is more preferable that the cured product is included in a structural product in combination with a connection terminal portion having a surface portion thereof that is flush with the ground surface so as to be used for forming the rewiring layer on the ground surface. Among these, it is especially preferable that the cured product is used for forming the rewiring layer after a thin film layer is formed on the ground surface. It is preferable that the thin film layer is formed by an applying method by utilizing the merit that the ground surface of the cured product has a superior uniform applicability of a resin.

6. Structural Body Including the Cured Product

The cured product may be included in a structural body in combination with a connection terminal portion to be connected to the rewiring layer. In the structural body, usually, the rewiring layer is formed on the ground surface of the cured product so as to be connected to the connecting terminal portion.

The connection terminal portion is usually a member formed of a conductive material in the cured product. Examples of the connection terminal portion include an embedded wiring layer formed in the cured product and a terminal of the component formed in the cured product. The connection terminal portion has a surface portion not covered with the cured product so as to be able to be connected to the rewiring layer. Therefore, the surface portion of the connection terminal portion is exposed. The rewiring layer is connected to this surface portion of the connection terminal portion.

Usually, the connection terminal portion is provided in the cured product. The connection terminal portion is ground together with the cured product at the time when the cured product is ground in order to form the ground surface of the cured product. Thus, the surface portion of the connection terminal portion is exposed. Therefore, except for the depressed portion, the surface portion of the connection terminal portion is usually a ground surface that is flush with the ground surface of the cured product. In the explanation hereinafter, in order to clearly distinguish between these surfaces, the ground surface of the cured product may be called "cured product-ground surface", and the surface portion as the ground surface of the connection terminal portion may be called "terminal-ground surface". The ground surface of the entire structural body including the cured product-ground surface and the terminal-ground surface may be called "structural body-ground surface".

Usually the connection terminal portion is formed of a conductive material. Examples of the conductive material include a material containing one or more metals selected from the group consisting of gold, platinum, palladium, silver, copper, aluminum, cobalt, chromium, zinc, nickel, titanium, tungsten, iron, tin, and indium. The conductive material formed of any of a single metal and a metal alloy may be used.

Examples of the connection terminal portion include a wiring layer. In order to function as a circuit, the wiring layer is usually patterned. The ratio of the line (circuit width)/space (width between the circuits) of the wiring layer is not particularly restricted. The ratio may be, for example, 20/20 µm or less (namely, pitch is 40 µm or less). The pitch may be uniform or non-uniform in the entire wiring layer. Thickness of the wiring layer is preferably 3 µm to 35 µm, more preferably 5 µm to 30 µm, still more preferably 10 µm to 20 µm, and especially preferably 15 µm to 20 µm. The thickness of the wiring layer may be even or uneven.

Examples of other connection terminal portion include a terminal of a component. Examples of the component include: passive components such as a condenser, an inductor, and a resistor; and active components such as a semiconductor bare chip.

The method for providing the connection terminal portion is not particularly restricted. For example, in the step (1) in the production method of the cured product, the connection terminal portion can be provided in the cured product by using the substrate including the connection terminal portion.

When the resin composition layer is formed on the substrate including the connection terminal portion, the connection terminal portion is embedded in the resin composition layer. Therefore, when the resin composition is cured, the cured product having the connection terminal portion included therein can be formed. Then, when the cured product is ground to expose the connection terminal portion, the connection terminal portion having the terminal-ground surface not covered with the cured product can be provided in the cured product. Usually, the connection terminal portion is also ground at the time of grinding of the cured product, so that the terminal-ground surface of the connection terminal portion is flush with the cured product-ground surface of the cured product.

Hereinafter, embodiments of the structural body will be explained with referring to drawings. The structural body is not limited to the embodiments described below.

6.1. First Embodiment of the Structural Body

Figure 5:
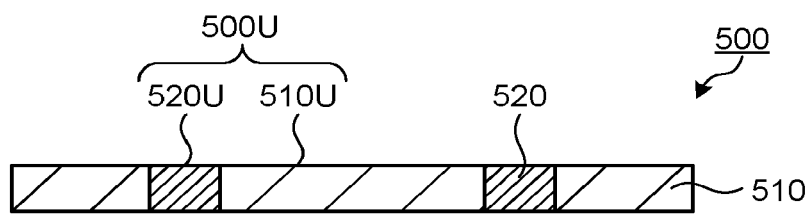
FIG. 5 is a sectional view schematically illustrating the wiring board as a first embodiment of the structural body.
Figure 6:
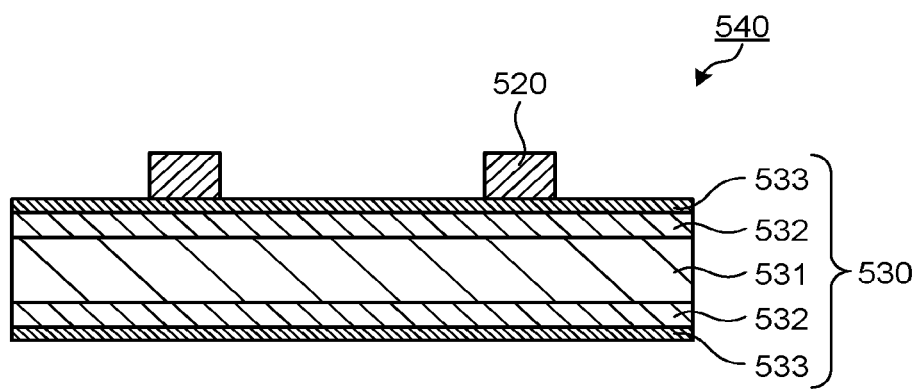
FIG. 6 is a sectional view schematically illustrating the production process of the wiring board as the first embodiment of the structural body.
Figure 7:
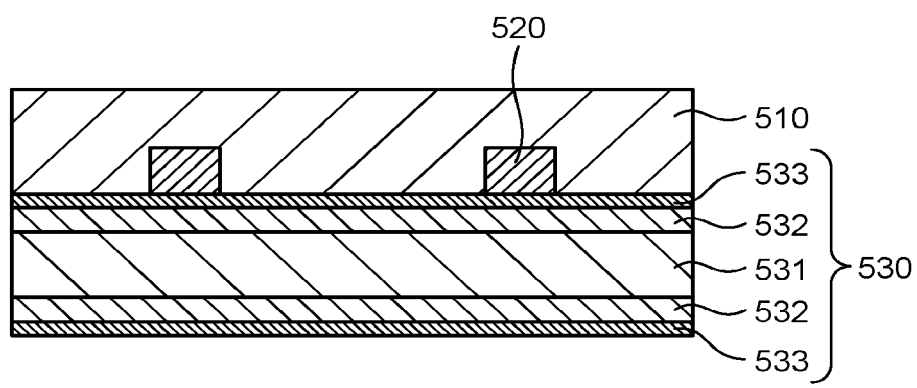
FIG. 7 is a sectional view schematically illustrating the production process of the wiring board as the first embodiment of the structural body.
Figure 8:
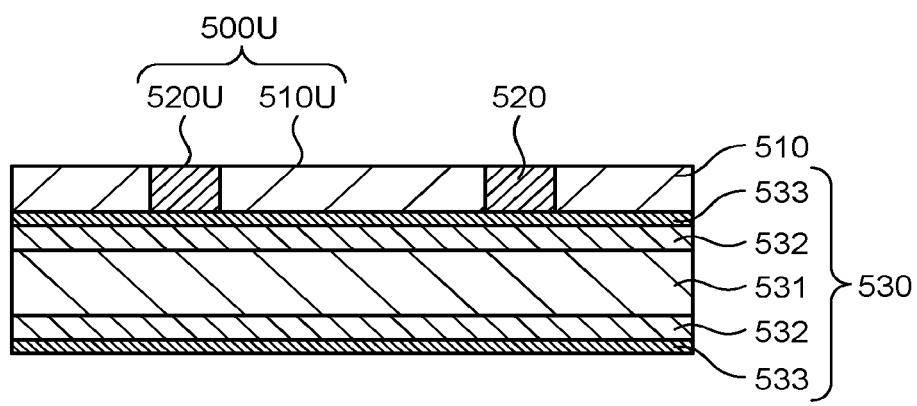
FIG. 8 is a sectional view schematically illustrating the production process of the wiring board as the first embodiment of the structural body.

FIG. 5 is a sectional view schematically illustrating a wiring board 500 as the first embodiment of the structural body. FIG. 6 to FIG. 8 each is a sectional view schematically illustrating the production process of the wiring board 500 as the first embodiment of the structural body. In FIG. 5 to FIG. 8, the same portions are donated by the same reference symbols.

As illustrated in FIG. 5, the wiring board 500 as the first embodiment of the structural body comprises a cured layer 510 as the cured product formed of the cured material obtained by curing the resin composition, and a wiring layer 520 as the connection terminal portion formed in the cured layer 510. The cured layer 510 has a cured product-ground surface 510U at least on one side thereof. The wiring layer 520 has a terminal-ground surface 520U at least on one side thereof. The terminal-ground surface 520U is not covered with the cured layer 510, and constitutes a plane that is flush with the cured product-ground surface 510U. Therefore, a structural body-ground surface 500U including the cured product-ground surface 510U and the terminal-ground surface 520U constitutes a flat surface that is flush except for a depressed portion (not illustrated in the drawing) present on the cured product-ground surface 510U.

In the wiring board 500, the cured layer 510 is formed of the cured material of the resin composition mentioned above. Therefore, the maximum depth D of the depressed portion present on the cured product-ground surface 510U is as small as less than 10 µm. Accordingly, a resin such as a photoresist can be uniformly applied onto the structural body-ground surface 500U. As a result, a thin film layer can be uniformly formed (not illustrated in the drawing). Thus, a fine rewiring layer can be formed on the structural body-ground surface 500U via this thin film layer.

The wiring board 500 can be produced, for example, by a production method including the steps of:

(A1) preparing a wiring layer-attached substrate 540 comprising a substrate 530 and the wiring layer 520 formed on the substrate 530 (see FIG. 6), (A2) forming a resin composition layer on the wiring layer-attached substrate 540 so as to embed the wiring layer 520 in the resin composition layer (not illustrated in the drawing), (A3) curing the resin composition to form the cured layer 510 (see FIG. 7), (A4) grinding the cured layer 510 (see FIG. 8), and (A5) removing the substrate (see FIG. 5).

In the step (A1), as illustrated in FIG. 6, the wiring layer-attached substrate 540 including the wiring layer 520 is prepared. In this embodiment, the example is described as to the case that the substrate 530 comprises a board 531, first metal layers 532 formed on both surfaces of the board 531, and second metal layers 533 formed on the surface of the first metal layers 532. Therefore, the wiring layer-attached substrate 540 includes the wiring layer 520 on a surface of one second metal layer 533 of the substrate 530 on a side opposite to the board 531. The wiring layer-attached substrate 540 can be prepared, for example, by the method described in Japanese Patent Application Laid-open No. 2017-82201, which is incorporated herein by reference in its entirety.

In the step (A2), the resin composition layer is formed on the wiring layer-attached substrate 540 thus prepared. The resin composition layer is formed in such a way that the wiring layer 520 be embedded into the resin composition layer. The resin composition layer may be formed by laminating a resin sheet (not illustrated in the drawing) and the wiring layer-attached substrate 540, or by a compression molding method.

In the step (A3), as illustrated in FIG. 7, after the resin composition layer is formed on the wiring layer-attached substrate 540, the resin composition is cured to form the cured layer 510. Usually, the resin composition is cured by a thermal curing.

In the step (A4), as illustrated in FIG. 8, the cured layer 510 is ground. As a result, the cured product-ground surface 510U is formed on the surface of the cured layer 510. With grinding of the cured layer 510, the wiring layer 520 is exposed to form the terminal-ground surface 520U. Accordingly, the structural body-ground surface 500U having a superior uniform applicability can be obtained.

Then, if necessary, the substrate 530 is removed as described in the step (A5). As a result, the thin wiring board 500 can be obtained, as illustrated in FIG. 5. The removal method of the substrate 530 is not particularly restricted. For example, the method may be employed in which the second metal layer 533 is separated from the first metal layer 532 at their interface followed by removal of the second metal layer 533 by means of an etching solution such as an aqueous copper chloride solution.

6.2. Second Embodiment of the Structural Body

Figure 9:
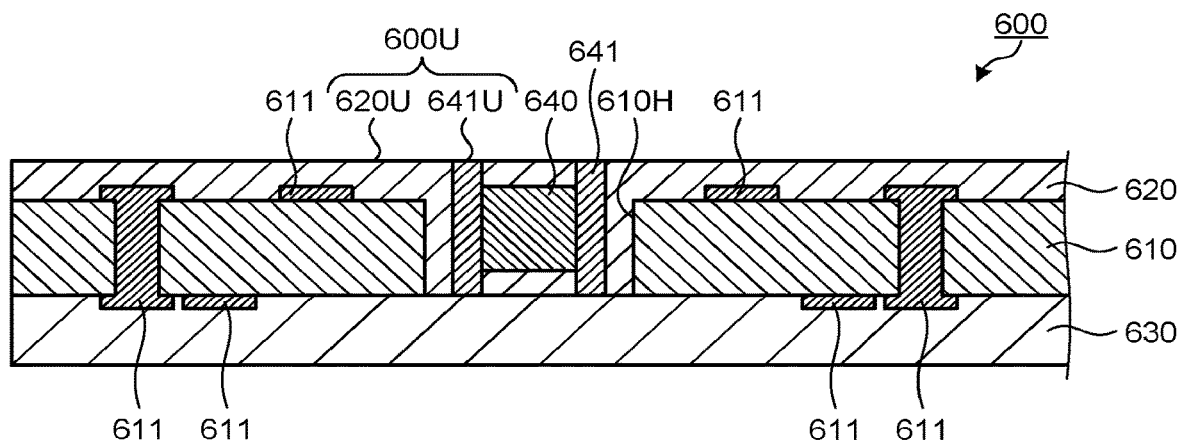
FIG. 9 is a sectional view schematically illustrating the component-incorporated circuit board as a second embodiment of the structural body.

FIG. 9 is a sectional view schematically illustrating a component-incorporated circuit board 600 as the second embodiment of the structural body. FIG. 10 to FIG. 13 each is a sectional view schematically illustrating the production process of the component-incorporated circuit board 600 as the second embodiment of the structural body. In FIG. 9 to FIG. 13, the same portions are donated by the same reference symbols.

As illustrated in FIG. 9, the component-incorporated circuit board 600 as the second embodiment of the structural body comprises a board 610 and a cured layer 620 as the cured product formed of the cured material obtained by curing the resin composition on one side of the board 610, an insulating layer 630 provided on the other side of the board 610, and a component 640 provided in the cured layer 620. The component 640 includes a terminal 641 as the connection terminal portion formed of a conductive material. In this embodiment, the example is described in which a cavity 610H is formed in the board 610 such that the cavity penetrates the board 610 in the thickness direction, and the component 640 is provided in the cavity 610H. The board 610 may include a wiring layer 611 such as a via wiring and a surface wiring.

The cured layer 620 has a cured product-ground surface 620U on the side opposite to the board 610. The terminal 641 of the component 640 has a terminal-ground surface 641U. The terminal-ground surface 641U constitutes a flat surface that is flush with the cured product-ground surface 620U and is not covered with the cured layer 620. Therefore, a structural body-ground surface 600U including the cured product-ground surface 620U and the terminal-ground surface 641U constitute a flat surface that is flush except for the depressed portion (not illustrated in the drawing) present on the cured product-ground surface 620U.

In the component-incorporated circuit board 600, the cured layer 620 is formed of the cured material of the resin composition. Therefore, the maximum depth D of the depressed portion present on the cured product-ground surface 620U is as small as less than 10 µm. Accordingly, a resin such as a photoresist can be uniformly applied onto the structural body-ground surface 600U. As a result, a thin film layer can be uniformly formed (not illustrated in the drawing). Thus, a fine rewiring layer can be formed on the structural body-ground surface 600U via this thin film layer.

The component-incorporated circuit board 600 can be produced, for example, by a production method including the steps of:

(B1) preparing a temporarily component-attached substrate 660 including the board 610, a temporarily attaching member 650 provided on one side of the board 610, and the component 640 accommodated in the cavity 610H of the board 610 by temporarily attaching to the temporarily attaching member 650 (see FIG. 10), (B2) forming a resin composition layer on the temporarily component-attached substrate 660 so as to embed the component 640 into the resin composition layer (not illustrated in the drawing), (B3) curing the resin composition to form the cured layer 620 (see FIG. 11), (B4) grinding the cured layer 620 (see FIG. 12), (B5) removing the temporarily attaching member 650 (see FIG. 13), and (B6) forming the insulating layer 630 (see FIG. 9).

Figure 10:
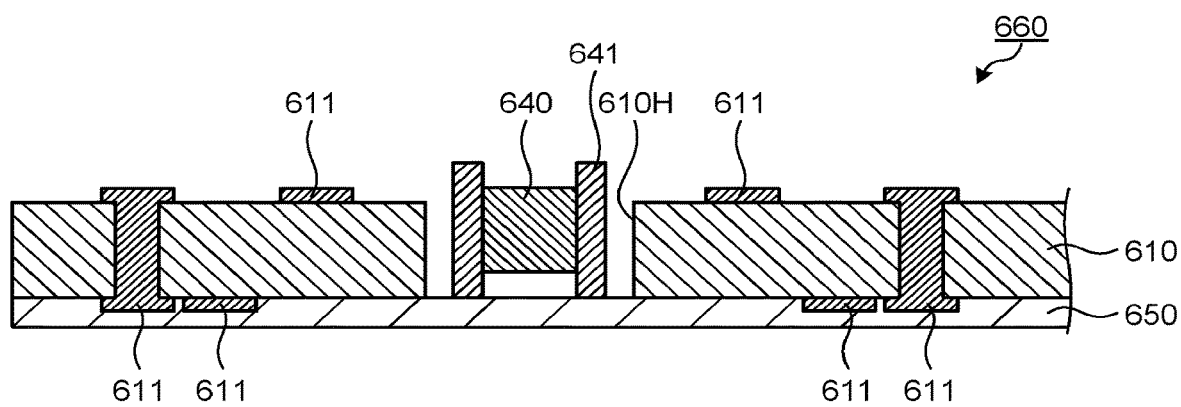
FIG. 10 is a sectional view schematically illustrating the production process of the component-incorporated circuit board as the second embodiment of the structural body.

In the step (B1), the temporarily component-attached substrate 660 including the board 610, the component 640, and the temporarily attaching member 650 is prepared, as illustrated in FIG. 10. In this embodiment, the example is described as to the case that the temporarily attaching member 650 in the form of a film is used. The temporarily attaching member 650 is in contact with one side of the board 610. The component 640 is temporarily attached to the temporarily attaching member 650 in the cavity 610H of the board 610. The temporarily component-attached substrate 660 may be prepared, for example, by the method described in Japanese Patent Application Laid-open No. 2017-039305, which is incorporated herein by reference in its entirety.

In the step (B2), the resin composition layer is formed on the temporarily component-attached substrate 660 thus prepared. At this time, the resin composition layer is formed in such a way that the component 640 be embedded into the resin composition layer. The resin composition layer may be formed by laminating a resin sheet (not illustrated in the drawing) and the temporarily component-attached substrate 660, or by a compression molding method.

Figure 11:
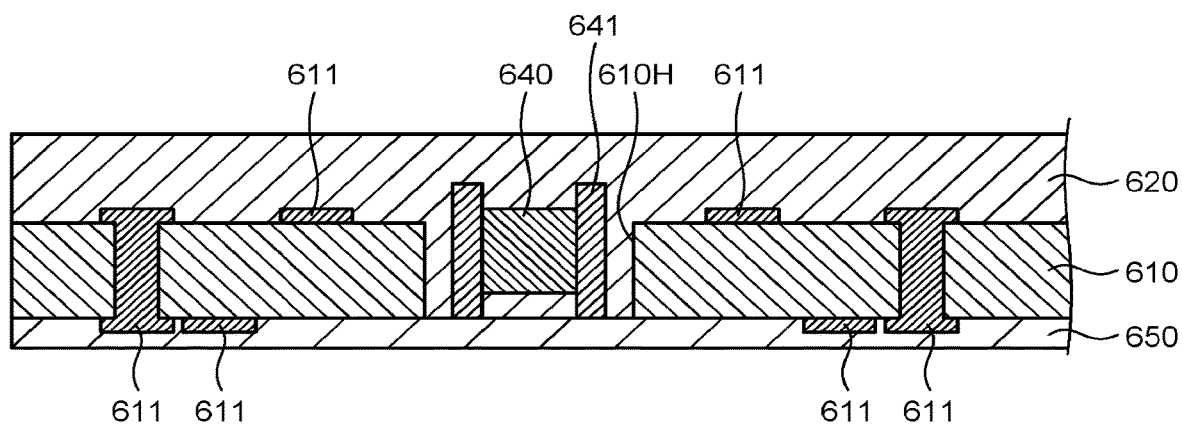
FIG. 11 is a sectional view schematically illustrating the production process of the component-incorporated circuit board as the second embodiment of the structural body.

In the step (B3), as illustrated in FIG. 11, after the resin composition layer is formed on the temporarily component-attached substrate 660, the resin composition is cured to form the cured layer 620. Usually, the resin composition is cured by a thermal curing.

Figure 12:
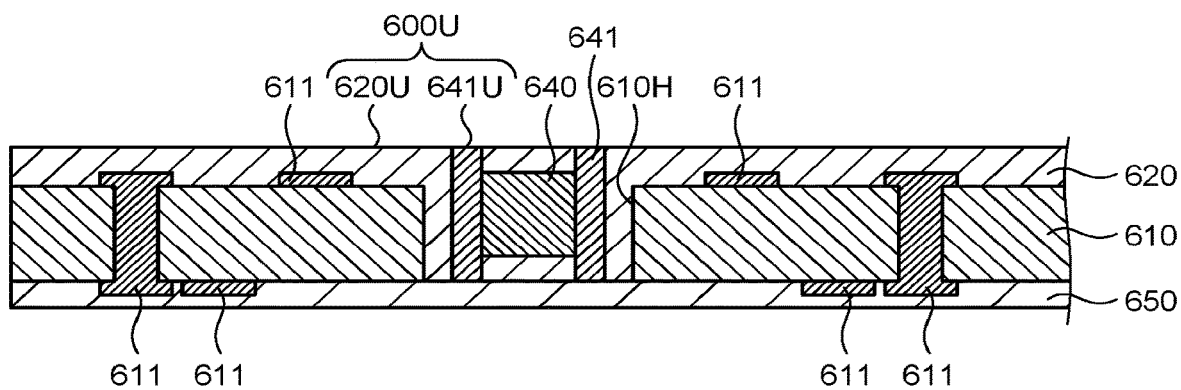
FIG. 12 is a sectional view schematically illustrating the production process of the component-incorporated circuit board as the second embodiment of the structural body.

In the step (B4), as illustrated in FIG. 12, the cured layer 620 is ground. As a result, the cured product-ground surface 620U is formed on the surface of the cured layer 620. With grinding of the cured layer 620, the terminal 641 of the component 640 is exposed to form the terminal-ground surface 641U. Accordingly, the structural body-ground surface 600U having a superior uniform applicability can be obtained.

Figure 13:
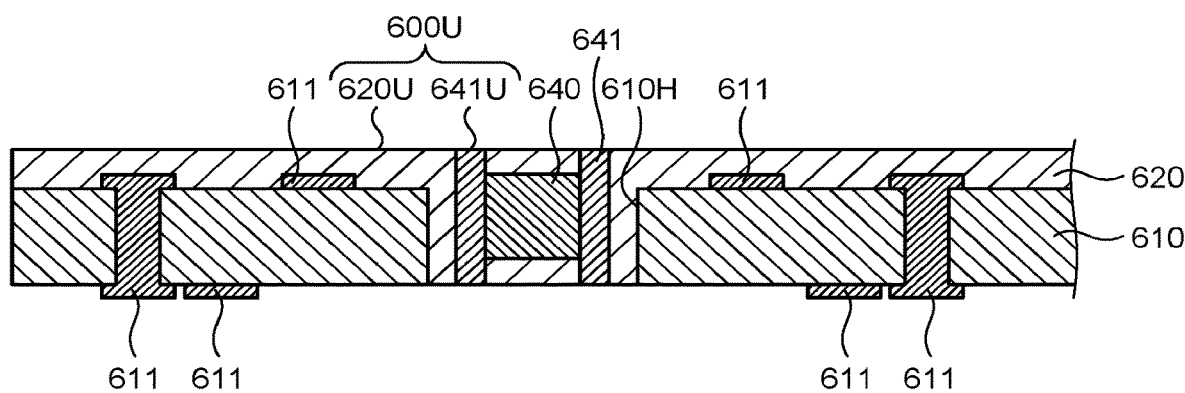
FIG. 13 is a sectional view schematically illustrating the production process of the component-incorporated circuit board as the second embodiment of the structural body.

If necessary, the step (B5) of removing the temporarily attaching member 650 as illustrated in FIG. 13 and the step (B6) of forming the insulating layer 630 are carried out. As a result, the component-attached circuit board 600 including the component 640 embedded therein can be obtained, as illustrated in FIG. 9. The formation method of the insulating layer 630 is arbitrary. For example, the method may be employed in which the resin composition layer is formed on the board 610, followed by curing the resin composition layer to form the insulating layer having the same composition as the cured layer 620.

The cured layer 620 may be ground at any point of time after formation of the cured layer 620. Therefore, the grinding may be carried out before removal of the temporarily attaching member 650 and formation of the insulating layer 630, or after formation of the insulating layer 630.

6.3. Other Embodiments of the Structural Body

The structural body according to the above-mentioned embodiments may be carried out with the embodiments further modified thereof.

For example, in the first embodiment, the wiring layer 520 having a uniform thickness was taken as the example. However, the thickness of the wiring layer 520 may be non-uniform. In the grinding of the cured layer 510, it is not necessary to expose whole of the wiring layer 520. The grinding of the cured layer 510 may be performed so as to expose a part of the wiring layer 520.

Figure 14:
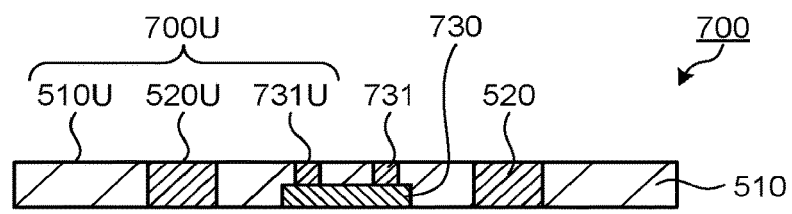
FIG. 14 is a sectional view schematically illustrating the wiring board as the modification of the first embodiment of the structural body.

For example, a component may be provided in the wiring board 500 according to the first embodiment. Hereinafter, the example thereof will be explained with referring to the drawing. FIG. 14 is a sectional view schematically illustrating a wiring board 700 as the modification of the first embodiment of the structural body. In FIG. 14, portions that are the same as those in the wiring board 500 according to the first embodiment are donated by the same reference symbols as those in the wiring board 500 according to the first embodiment. As illustrated in FIG. 14, the wiring board 700 as the modification of the first embodiment is formed in the same manner as the wiring board 500 according to the first embodiment except that a chip 730 is installed as the component in the cured layer 510. The chip 730 has a pillar portion 731 as the connection terminal portion formed of a conductive material. The pillar portion 731 has a terminal-ground surface 731U as the surface portion not covered with the cured layer 510. The terminal-ground surface 731U constitutes an flat surface that is flush with the cured product-ground surface 510U of the cured layer 510 and the terminal-ground surface 520U of the wiring layer 520. Therefore, a structural body-ground surface 700U including the cured product-ground surface 510U, the terminal-ground surface 520U and the terminal-ground surface 731U constitute an flat surface that is flush except for the depressed portion (not illustrated in the drawing) present on the cured product-ground surface 510U. The wiring board 700 can have the same merits as the wiring board 500 according to the first embodiment.

The wiring board 700 can be produced, for example, by the same method as the production method of the wiring board 500 according to the first embodiment except that, prior to the step (A2), the chip 730 is provided on the wiring layer-attached substrate 540 and not only the wiring layer 520 but also the pillar portion 731 of the chip 730 is exposed by the grinding in the step (A4).

In the second embodiment, only the terminal 641 of the component 640 was exposed. For example, not only the terminal 641 but also the wiring layer 611 may be exposed by grinding of the cured layer 620.

Figure 15:
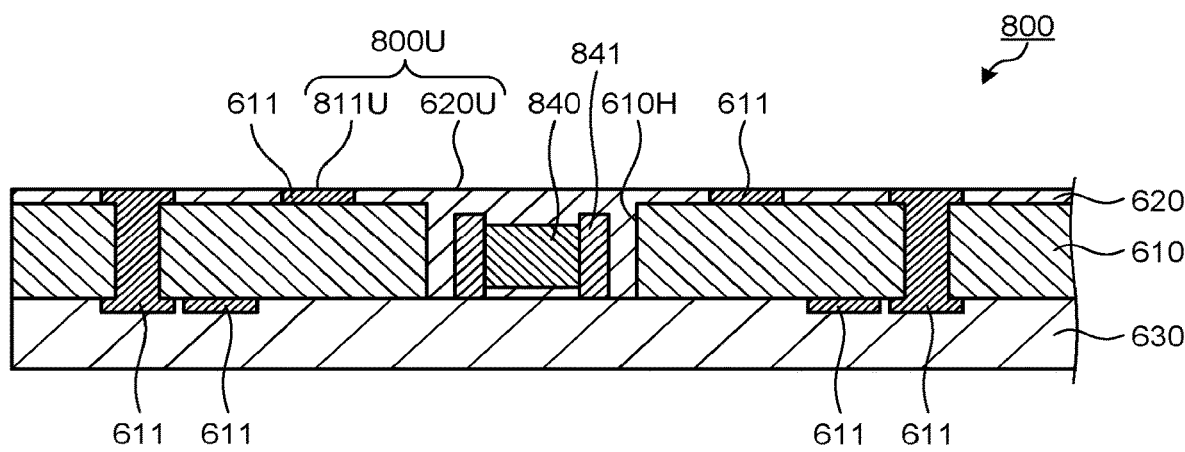
FIG. 15 is a sectional view schematically illustrating the component-incorporated circuit board as the modification of the second embodiment of the structural body.

For example, the component-incorporated circuit board according to the second embodiment may be carried out using a component that is thinner than the depth of the cavity 610H. Hereinafter, the example thereof will be explained with referring to the drawing. FIG. 15 is a sectional view schematically illustrating a component-incorporated circuit board 800 as the modification of the second embodiment of the structural body. In FIG. 15, portions that are the same as those in the component-incorporated circuit board 600 according to the second embodiment are donated by the same reference symbols as those in the component-incorporated circuit board 600 according to the second embodiment. As illustrated in FIG. 15, the component-incorporated circuit board 800 as the modification of the second embodiment is formed in the same manner as the component-incorporated circuit board 600 according to the second embodiment except that a component 840 that is thinner than the depth of the cavity 610H is used and that the terminal-ground surface 811U as the surface of the wiring layer 611 is not covered with the cured layer 620. The terminal-ground surface 811U constitutes a flat surface that is flush with the cured product-ground surface 620U of the cured layer 620. Therefore, a structural body-ground surface 800U including the cured product-ground surface 620U and the terminal-ground surface 811U constitute a flat surface that is flush except for the depressed portion (not illustrated in the drawing) present on the cured product-ground surface 620U. The component-incorporated circuit board 800 can have the same merits as those of the component-incorporated circuit board 600 according to the second embodiment. The component 840 is thinner than the depth of the cavity 610H. Thus, a terminal portion 841 of the component 840 is usually covered with the cured layer 620.

The component-incorporated circuit board 800 may be produced, for example, by the same method as the production method of the component-incorporated circuit board 600 according to the second embodiment except that the component 840 is used in place of the component 640, and the wiring layer 611 is exposed by grinding in the step (B4).

7. Formation of Rewiring Layer

It is preferable that the cured product be used for formation of a rewiring layer on the cured product-ground surface. It is preferable that the rewiring layer be formed on the cured product-ground surface via a thin film layer after this thin film layer is formed on the cured product-ground surface. Hereinafter, one embodiment of the method for forming the rewiring layer will be explained with referring to the drawings. The method for forming the rewiring layer is not limited to the embodiment described below.

Figure 16:
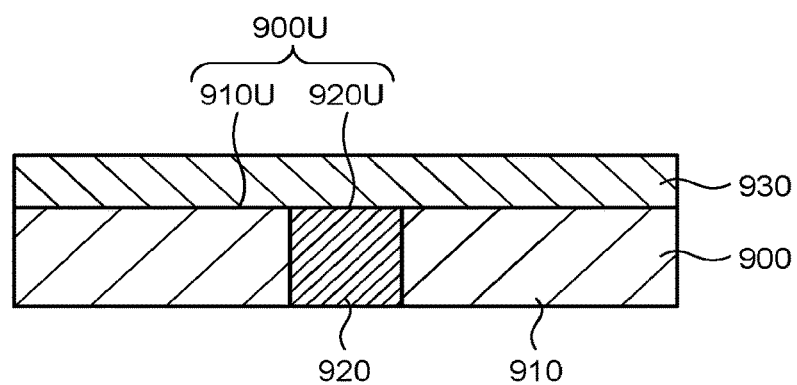
FIG. 16 is a sectional view schematically illustrating the structural body in order to explain one embodiment of the method for forming the rewiring layer.
Figure 17:
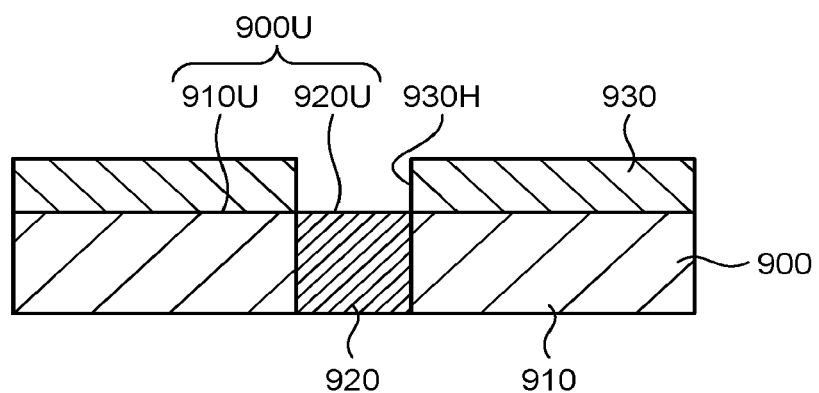
FIG. 17 is a sectional view schematically illustrating the structural body in order to explain one embodiment of the method for forming the rewiring layer.
Figure 18:
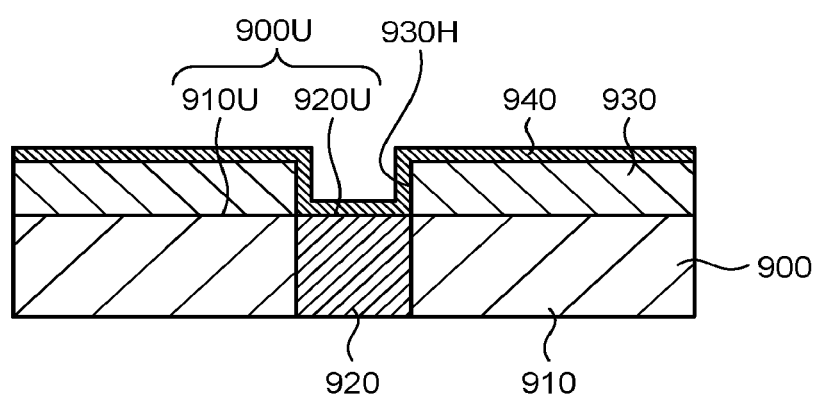
FIG. 18 is a sectional view schematically illustrating the structural body in order to explain one embodiment of the method for forming the rewiring layer.

FIG. 16 to FIG. 18 each is a sectional view schematically illustrating a structural body 900 in order to explain one embodiment of the method for forming the rewiring layer. As illustrated in FIG. 16 to FIG. 18, in this embodiment, the example will be explained with regard to the case that the structural body 900 including a cured layer 910 as the cured product and a connection terminal portion 920 is used.

As illustrated in FIG. 16, in this method, a step (C1) of forming a thin film layer 930 on a structural body-ground surface 900U of the structural body 900 is carried out.

Usually, the thin film layer 930 is formed so as to cover both a cured product-ground surface 910U and a terminal-ground surface 920U. Usually, this thin film layer 930 is formed through applying a suitable resin material onto the structural body-ground surface 900U. The thin film layer 930 usually functions as an insulating layer having an insulating property.

Examples of the resin material to be used as the material of the thin film layer 930 include a photosensitive resin and a thermosetting resin. In particular, a photosensitive resin is preferable. Because the photosensitive resin can be used as a photoresist, a fine pattern can be readily formed by means of a photolithography. Therefore, when the photosensitive resin is used, a fine rewiring layer can be readily formed. Accordingly, the structural body 900 having the cured product-ground surface 910U not having a large depressed portion is advantageous in that the fine rewiring layer can be formed.

Usually, the resin material is applied in the liquid state onto the structural body-ground surface 900U of the structural body 900 and then cured to form the thin film layer 930. At the time of applying, it is preferable that the resin material have an particular viscosity suitable for applying. The viscosity of the resin material at the time of applying may be, for example, 1 Pa·s to 30 Pa·s. Because the cured product-ground surface 910U of the cured layer 910 does not have large depressed portion, even if the resin material having the viscosity as described above is applied onto the structural body-ground surface 900U, the defect is not readily formed in the thin film layer 930 thus formed.

There is no particular restriction in the applying method of the resin material. For example, a spin coating method may be used. The condition of the spin coating is appropriately controlled so as to obtain the thin film layer 930 having an intended thickness. For example, the rotation number in the spin coating is preferably 500 rpm or more, and more preferably 700 rpm or more, and is preferably 7,000 rpm or less, and more preferably 6,000 rpm or less. Even in the application under these conditions, generation of the defect in the thin film layer 930 can be suppressed.

In view of thinning, the thickness of the thin film layer 930 is preferably 50 μm or less, more preferably 40 μm or less, still more preferably 30 μm or less, and especially preferably 25 μm or less. In the case that the thin film layer 930 is thin as described above, there is a possibility to form a defect in the thin film layer 930 if the cured product-ground surface has a large depressed portion. However, because the cured product-ground surface 910U of the structural body 900 according to this embodiment does not have the large depressed portion, the defect in the thin film layer 930 can be suppressed. The lower limit of the thickness of the thin film layer 930 is not particularly restricted. The lower limit may be, for example, 1 μm or more.

After the thin film layer 930 is formed, a step (C2) of forming a via hole 930H in the thin film layer 930 may be carried out, as illustrated in FIG. 17. Through this via hole 930H, the connection terminal portion 920 and the rewiring layer can be connected.

In the formation method of the via hole 930H when the material of the thin film layer 930 is a photosensitive resin, usually, an active energy beam is irradiated to the surface of the thin film layer 930 via a mask pattern so as to photo-cure the irradiated part of the thin film layer 930. Examples of the active energy beam include a ultra violet ray, a visible ray, an electron beam, and an X-ray. A ultra violet ray is especially preferable. The irradiation amount and the irradiation time of the ultra violet ray can be appropriately determined in accordance with the photosensitive resin. Examples of the exposure method include a contact exposure method in which exposure is carried out with contacting a mask pattern to the thin film layer 930, and a noncontact exposure method in which exposure is carried out by using a parallel ray without contacting the mask pattern to the thin film layer 930. After the thin film layer 930 is photo-cured, the thin film layer 930 is developed, and then, a non-exposed portion is removed to form the via hole 930H. Development may be carried out by any of a wet development and a dry development. Examples of the development method include a dip method, a paddle method, a spray method, a blushing method, and a scrapping method. A paddle method is preferable in view of resolution.

Examples of the formation method of the via hole 930H when the material of the thin film layer 930 is a thermosetting resin include a laser irradiation, an etching, and a mechanical drilling. Among them, a laser irradiation is preferable. The laser irradiation can be carried out using a suitable laser processing apparatus with a light source such as a carbonic acid gas laser, a UV-YAG laser, and an excimer laser.

The shape of the via hole 930H is usually circular, or almost circular. The top diameter of the via hole is preferably 50 μm or less, more preferably 30 μm or less, and still more preferably 20 μm or less, and is preferably 3 μm or more, more preferably 10 μm or more, and still more preferably 15 μm or more. The top diameter of the via hole means the diameter of the opening of the via hole on the surface of the thin film layer 930.

After the thin film layer 930 is formed and then, if necessary, after the via hole 930H is formed, a step (C3) of forming a rewiring layer 940 on the structural body-ground surface 900U via the thin film layer 930 is carried out, as illustrated in FIG. 18.

The rewiring layer 940 can be formed, for example, by the method including a step of laminating a dry film (not illustrated in the drawing) as a photosensitive resist film onto the thin film layer 930, a step of performing exposure and development to the dry film with a patterned mask under a predetermined condition to form a pattern so as to obtain a patterned dry film, a step of forming the rewiring layer 940 by a plating method such as an electrolytic plating method using the patterned dry film thus developed as a plating mask, and a step of removing the patterned dry film.

The rewiring layer 940 is usually patterned. A ratio, line (circuit width)/space (width between circuits), of the rewiring layer 940 is preferably small. Specifically, the range of the line/space ratio is preferably 20/20 μm or less (namely, the pitch is 40 μm or less), more preferably 10/10 μm or less, still more preferably 5/5 μm or less, far more preferably 1/1 μm or less, and especially preferably 0.5/0.5 μm or less. The pitch is not necessarily uniform in the entire rewiring layer 940. The minimum pitch of the rewiring layer 940 may be, for example, 40 μm or less, 36 μm or less, or 30 μm or less. One merit of using the cured layer 910 as the cured product having the cured product-ground surface 910U is that the fine rewiring layer 940 can be formed.

Thickness of the rewiring layer 940 is preferably 3 μm to 35 μm, more preferably 5 μm to 30 μm, still more preferably 10 μm to 20 μm, and especially preferably 15 μm to 20 μm, although this is dependent on the wiring design.

In view of utilizing the superior effects of the present invention, it is preferable that the thin film layer 930 be formed by the applying method as mentioned in the above embodiment. However, the present invention does not exclude the embodiment in which the thin film layer 930 is formed by the method other than the applying method. Therefore, for example, the thin film layer 930 may be formed by laminating a film corresponding to the thin film layer 930 onto the structural body 900.

8. Resin Sheet

The resin sheet of the present invention comprises a support and a resin composition layer provided on the support. The resin composition layer is the layer that includes the resin composition. Usually the resin composition layer is formed of the resin composition. When the resin sheet is used, the cured product having the cured product-ground surface having a superior uniform applicability of a resin can be obtained.

In view of thinning, thickness of the resin composition layer is preferably 200 μm or less, more preferably 150 μm or less, still more preferably 100 μm or less, 80 μm or less, 60 μm or less, 50 μm or less, or 40 μm or less. The lower limit of the thickness of the resin composition layer is not particularly restricted. The lower limit may be, for example, 10 μm or more.

Examples of the support include a film formed of a plastic material, metal foil, and a releasing paper. Metal foil and a film formed of a plastic material are preferable.

When the film formed of a plastic material is used as the support, examples of the plastic material include polyester such as polyethylene terephthalate (hereinafter, may be simply called "PET") and polyethylene naphthalate (hereinafter, may be simply called "PEN"); polycarbonate (hereinafter, may be simply called "PC"); acrylic polymers such as polymethyl methacrylate (hereinafter, may be simply called "PMMA"); a cyclic polyolefin; triacetyl cellulose (hereinafter, may be simply called "TAC"); polyether sulfide (hereinafter, may be simply called "PES"); polyether ketone; and polyimide. Among them, polyethylene terephthalate and polyethylene naphthalate are preferable, and polyethylene terephthalate is especially preferable since it is inexpensive.

When the metal foil is used as the support, examples of the metal foil include copper foil and aluminum foil. Among them, copper foil is preferable. As to the copper foil, the foil formed of a copper single metal or an alloy of copper with other metal (for example, tin, chromium, silver, magnesium, nickel, zirconium, silicon, and titanium) may be used.

The support may be subjected to a treatment such as a mat treatment, a corona treatment, or an antistatic treatment on the surface to be in contact with the resin composition layer.

As to the support, a releasing layer-attached support including a releasing layer on the surface to be in contact with the resin composition layer may be used. A releasing agent used in the releasing layer of the releasing layer-attached support may be one or more releasing agents selected from the group consisting of, for example, an alkyd resin, a polyolefin resin, a urethane resin, and a silicone resin. Examples of the releasing agent that is commercially available include "SK-1" "AL-5", and "AL-7", manufactured by Lintech Corp, which are alkyd resin type releasing agents. Examples of the releasing layer-attached support include "Lumirror T60" manufactured by Toray Industries; "Purex" manufactured by Teijin Ltd.; and "Unipeel" manufactured by Unitika Ltd.

Thickness of the support is preferably in the range of 5 μm to 75 μm, and more preferably in the range of 10 μm to 60 μm. When the releasing layer-attached support is used, total thickness of the releasing layer-attached support is preferably within this range.

The resin sheet may be produced, for example, by applying the resin composition onto the support using an applying apparatus such as a die coater. If necessary, the resin composition may be dissolved into an organic solvent to prepare a resin varnish. And then, the resin varnish may be applied to produce the resin sheet. When the solvent is used, viscosity can be controlled so as to improve applicability. In the case that the resin varnish is used, usually, the resin varnish is dried after the applying thereof so as to form the resin composition layer.

Examples of the organic solvent include ketone solvent such as acetone, methyl ethyl ketone, and cyclohexanone; acetate ester solvent such as ethyl acetate, butyl acetate, cellosolve acetate, propylene glycol monomethyl ether acetate, and carbitol acetate; carbitol solvent such as cellosolve and butyl carbitol; aromatic hydrocarbon solvent such as toluene and xylene; and amide solvent such as dimethyl formamide, dimethyl acetamide (DMAc), and N-methyl pyrrolidone. The organic solvent may be used aloe or in combination of two or more kinds thereof at any ratio.

Drying may be carried out by a publicly known method such as heating and blowing of a hot air. The drying is carried out under drying conditions so that the content of the organic solvent in the resin composition layer is usually 10% by mass or less, and preferably 5% by mass or less. When the resin varnish containing an organic solvent with the amount of, for example, 30% by mass to 60% by mass is used, the resin varnish can be dried at 50° C. to 150° C. for 3 minutes to 10 minutes to form the resin composition layer, although these conditions are different depending on the boiling point of the organic solvent in the resin varnish.

The resin sheet may include, if necessary, an optional layer other than the support and the resin composition layer. For example, in the resin sheet, a protection film similar to the support may be provided on the surface of the resin composition layer not be in contact with the support (namely, on the surface opposite to the support). Thickness of the protection film is, for example, 1 μm to 40 μm. When the protection film is provided, the surface of the resin composition layer can be prevented from attachment of dirt and the like as well as from a scar. In the case that the resin sheet includes the protection film, the resin sheet can be used after the protection film is removed. The resin sheet can be rolled up so as to be stored.

9. Semiconductor Devices

The cured product described above can be used in any semiconductor devices. Examples of the semiconductor device include various semiconductor devices used in electric products such as computer, mobile phone, smart phone, tablet type device, wearable device, digital camera, medical equipment, and television and vehicles such as motor bike, automobile, electric train, marine ship, and airplane.

Other features of the invention will become apparent in the course of the following descriptions of exemplary embodiments which are given for illustration of the invention and are not intended to be limiting thereof.

EXAMPLES

In the following description, "parts" and "%", which express quantities, mean "parts by mass" and "% by mass", respectively, unless otherwise specifically mentioned. The operations explained hereinafter were carried out under normal temperature and normal pressure unless otherwise specifically mentioned.

Explanation of Inorganic Filler

Inorganic Filler 1

Inorganic filler 1 is the one that is obtained by subjecting spherical silica 1 (average particle diameter of 3 μm and specific surface area of 4 m$^2$/g) to surface treatment with an amino silane compound ("KBM573"; N-phenyl-3-aminopropyl trimethoxy silane, manufactured by Shin-Etsu Chemical Co., Ld.). In the spherical silica 1, the particles having the particle diameter of 10 μm or more is removed by classification treatment. The spherical silica 1 includes a hollow filler particle having a hollow portion inside thereof. The maximum long diameter of the hollow portion was less than 5 μm.

Inorganic Filler 2

Inorganic filler 2 is the one that is obtained by subjecting spherical silica 2 (average particle diameter of 3.6 μm and specific surface area of 1 $m^2/g$) to surface treatment with an amino silane compound ("KBM573", N-phenyl-3-aminopropyl trimethoxy silane, manufactured by Shin-Etsu Chemical Co., Ld.). In the spherical silica 2, the particles having the particle diameter of 15 μm or more is removed by classification treatment. The spherical silica 2 includes a hollow filler particle having a hollow portion inside thereof. The maximum long diameter of the hollow portion was less than 5 μm.

Inorganic Filler 3

Inorganic filler 3 is the one that is obtained by subjecting spherical silica 3 (average particle diameter of 3.5 μm and specific surface area of 3.9 $m^2/g$) to surface treatment with an amino silane compound ("KBM573"; N-phenyl-3-aminopropyl trimethoxy silane, manufactured by Shin-Etsu Chemical Co., Ld.). In the spherical silica 3, the particles having the particle diameter of 10 μm or more is removed by classification treatment. The spherical silica 3 includes a hollow filler particle having a hollow portion inside thereof. In the spherical silica 3, the particles having the hollow portion with the maximum long diameter of 5 μm or more were included.

Inorganic Filler 4

Inorganic filler 4 is the one that is obtained by subjecting spherical silica 4 (average particle diameter of 3 μm and specific surface area of 4 $m^2/g$) to surface treatment with an epoxy silane compound ("KBM-403"; 3-glycidoxypropyl trimethoxy silane, manufactured by Shin-Etsu Chemical Co., Ld.). In the spherical silica 4, the particles having the particle diameter of 10 μm or more is removed by classification treatment. The spherical silica 4 includes a hollow filler particle having a hollow portion inside thereof. The maximum long diameter of the hollow portion was less than 5 μm.

Example 1

A mixture of 2 parts of a liquid epoxy resin ("ZX1059"; 1:1 mixture (mass ratio) of a bisphenol A type epoxy resin and a bisphenol F type epoxy resin; epoxy equivalent weight of 169 g/eq., manufactured by Nippon Steel & Sumikin Materials Co., Ltd.), 2 parts of a naphthalene type epoxy resin ("HP4032SS"; epoxy equivalent weight of 151 g/eq., manufactured by DIC Corp.), 4 parts of a glycidyl amine type epoxy resin ("630"; epoxy equivalent weight of 95 g/eq., manufactured by Mitsubishi Chemical Corp.), 115 parts of the inorganic filler 1, 2 parts of a naphthalene type epoxy resin ("ESN475V"; epoxy equivalent weight of about 330 g/eq., manufactured by Nippon Steel & Sumikin Materials Co., Ltd.), 10 parts of an acid anhydride-based curing agent ("HNA-100"; acid anhydride equivalent weight of 179 g/eq., manufactured by New Japan Chemical Co., Ltd.), 0.5 part of carbon black (DBP absorption amount of 80 $cm^3/100$ g, pH=6.5, and average particle diameter of 20 nm), 0.9 part by mass of rubber particles ("Stafiloid IM-401", manufactured by Ganz Chemical Co., Ltd.), and 0.1 part of a curing accelerator ("1B2PZ": 1-benzyl-2-phenyl imidazole, manufactured by Shikoku Chemicals Corp.) was uniformly dispersed using a mixer to obtain a resin composition.

Example 2

In place of 115 parts of the inorganic filler 1, 150 parts of the inorganic filler 2 was used. Except for the changes described above, the same operation as Example 1 was carried out to obtain a resin composition.

Example 3

The amount of the inorganic filler 1 was changed from 115 parts to 130 parts. In addition, 1 parts of a liquid epoxy resin ("YL7984"; epoxy equivalent weight of 540 g/eq., manufactured by Mitsubishi Chemical Corp.) was further added to the resin composition. Except for the changes described above, the same operation as Example 1 was carried out to obtain a resin composition.

Example 4

In place of 115 parts of the inorganic filler 1, 115 parts of the inorganic filler 4 was used. Except for the change described above, the same operation as Example 1 was carried out to obtain a resin composition.

Comparative Example 1

In place of 115 parts of the inorganic filler 1, 115 parts of the inorganic filler 3 was used. Except for the change described above, the same operation as Example 1 was carried out to obtain a resin composition.

Measurement of Depth of Depressed Portion on Ground Surface

The resin composition was laminated onto an 8-inch silicon wafer by using a vacuum laminator or a compression mold to form a resin composition layer having the thickness of 150 μm.

This resin composition layer was thermally cured at 180° C. for 1 hour to obtain a cured layer as the cured product (cured product before grinding) formed of the cured material of the resin composition.

Then, the surface of the cured layer was ground using a grinder ("DAG810", manufactured by Disco Corp.). This grinding was carried out until thickness of the cured layer after grinding thereof reached 100 μm. By the grinding, the cured product-ground surface having the arithmetic average roughness Ra of 100 nm or less was formed on the cured layer. As a result, a sample member including the silicon wafer and the cured layer that has the cured product-ground surface and is formed on the silicon wafer was obtained.

The cured layer was scraped using an FIB-SEM composite apparatus ("SMI3050SE", manufactured by SII Nanotechnology Inc.) so as to observe the section thereof. Specifically, the cured product was scraped by means of a focused ion beam (FIB) so as to expose the section that was perpendicular to the cured product-ground surface of the cured layer. The photograph of the section thus exposed was taken so as to obtain the SEM picture of the section (observation width of 60 μm and the observation magnification of 2,000). This observation of sections was carried out at 50 different places that were randomly selected.

From the SEM pictures of the sections of 50 different places thus obtained, the depths of the depressed portions on the cured product-ground surface of the cured layer were measured. The maximum value of the measured values of the depths thus obtained was taken as the maximum depth of the depressed portion on the cured product-ground surface.

When the maximum depth of the depressed portion on the cured product-ground surface was less than 5 μm, it was judged to be "A"; when the maximum depth was 5 μm or more and less than 10 μm, it was judged to be "B"; and when the maximum depth was 10 μm or more, it was judged to be "C".

Measurement of Surface Roughness of Ground Surface

The arithmetic average roughness Ra of the cured product-ground surface of the sample member produced in "Measurement of Depth of Depressed Portion on Ground Surface" was measured using a non-contact type surface roughness measurement apparatus ("WYKO NT3300", manufactured by Veeco Instruments Inc.). The measurement was carried out with the VSI mode and the measurement range of 121 μm×92 μm by using the lens with 50 magnifications. The measurement of the arithmetic average roughness Ra was carried out at 10 different places on the cured product-ground surface; and the average value thereof was taken.

Evaluation of Uniform Applicability of Ground Surface

The sample member produced in "Measurement of Depth of Depressed Portion on Ground Surface" was processed to a circular disk having a diameter of 4 inches. Then, a photosensitive polyimide resin (viscosity of 6 Pa·s) was spin-coated onto the cured product-ground surface of the cured layer at the rotation number of 2,000 rpm using a spin coater ("MS-A150", manufactured by Mikasa Co., Ltd.). The photosensitive polyimide resin thus applied was pre-baked at 120° C. for 5 minutes on a hot plate. A thin film layer having the thickness of 4 μm was obtained on the cured product-ground surface.

The operation mentioned above was carried out in 10 sample members.

The thin film layer thus obtained was observed; and the uniform applicability thereof was judged in accordance with the following standards.

"A": There is no defect in the thin film layer in all of the sample members.

"B": There is a defect in the thin film layer in one sample member.

"C": There is a defect in the thin film layer in two or more of the sample members.

Measurement of Dielectric Loss Tangent (60 GHz) of Cured Material of Resin Composition By using a compression molding apparatus (mold temperature of 130° C., pressure of 6 MPa, and cure time of 10 minutes), the resin composition was compression molded onto a SUS plate whose surface was release-treated to form a resin composition layer having the thickness of 300 μm. After the SUS plate was removed, the resin composition layer was thermally cured by heating at 180° C. for 90 minutes to obtain an evaluation sample for measurement of the dielectric loss tangent formed of the cured material of the resin composition. By using this evaluation sample, the dielectric loss tangent of the cured material was measured with a Fabry-Perot method with the measurement temperature at 24° C. and measurement frequency of 60 GHz using an analysis instrument ("Vector Network Analyzer N5227A", manufactured by Keysight Technologies, Inc.).

Measurement of Tensile Modulus of Elasticity of Cured Material of Resin Composition By using a compression molding apparatus (mold temperature of 130° C., pressure of 6 MPa, and cure time of 10 minutes), the resin composition was compression molded onto a SUS plate whose surface was release-treated to form a resin composition layer having the thickness of 300 μm. After the SUS plate was removed, the resin composition layer was thermally cured by heating at 180° C. for 90 minutes to obtain a cured film formed of the cured material of the resin composition. The cured film was cut to the shape of Dumbbell No. 1 to obtain a sample piece. Tensile modulus of elasticity of the sample piece was measured through a tensile strength measurement using an elongation tester ("RTC-1250A", manufactured by Orientec Co., Ltd.) to obtain the modulus at 25° C. The measurement was carried out in accordance with JIS K7127. Measurement of the modulus was carried out 3 times, and the average value thereof was taken as the tensile modulus of elasticity of the cured material.

Results

Results of Examples and Comparative Example are summarized in Table below.

TABLE 1

Results of Examples and Comparative Examples

| | Example | | | | Comparative Example |
|---|---|---|---|---|---|
| | 1 | 2 | 3 | 4 | 1 |
| (A)component | | | | | |
| ZX1059 | 2 | 2 | 2 | 2 | 2 |
| HP4032SS | 2 | 2 | 2 | 2 | 2 |
| 630 | 4 | 4 | 4 | 4 | 4 |
| ESN475V | 2 | 2 | 2 | 2 | 2 |
| YL7984 | | | | 1 | |
| (B)component | | | | | |
| HNA-100 | 10 | 10 | 10 | 10 | 10 |
| (C)component | | | | | |
| Inorganic Filler 1 | 115 | | 130 | | |
| Inorganic Filler 2 | | 150 | | | |
| Inorganic Filler 3 | | | | | 115 |
| Inorganic Filler 4 | | | | 115 | |
| (D)component | | | | | |
| 1B2PZ | 0.1 | 0.1 | 0.1 | 0.1 | 0.1 |
| (E)component | | | | | |
| IM-401 | 0.9 | 0.9 | 0.9 | 0.9 | 0.9 |
| (F)component | | | | | |
| Carbon Black | 0.5 | 0.5 | 0.5 | 0.5 | 0.5 |
| Maximum Depth of Depressed Portion on Ground Surface | A | B | A | A | C |
| Surface Roughness of Ground Surface [nm] | 60 | 89 | 56 | 87 | 70 |
| Uniform Applicability of Ground Surface | A | A | A | A | C |
| Dielectric Loss Tangent of Cured Material | 0.005 | 0.006 | 0.007 | 0.005 | 0.006 |
| Modulus of Elasticity of Cured Material [GPa] | 13 | 16 | 15 | 14 | 12 |

DISCUSSION

From the SEM pictures of the sections of the cured layers that were photographed for measurement of the depth of the depressed portion on the cured product-ground surface, it was confirmed that the cured product-ground surfaces had a depressed portion in any of Examples and Comparative Example.

In the depressed portions on the cured product-ground surface, the depressed portion formed on the filler surface part that appeared in the cured product-ground surface by grinding of the inorganic filler particle was included. It is presumed that this depressed portion was formed by opening of the hollow portion in the hollow filler particle included in the inorganic filler due to grinding thereof.

In other depressed portions on the cured product-ground surface, the depressed portion that was surrounded with a resin portion (component other than the inorganic filler) was included. It is presumed that this depressed portion was formed as the trace of the inorganic filler particle that was removed at the time of grinding of the cured layer.

As seen in Table 1, the maximum depth of these depressed portions is less than 10 μm in Examples. Therefore, the photosensitive polyimide resin can be uniformly applied onto the cured product-ground surface of the cured layer. Thus, the thin film layer having a superior surface flatness can be obtained. Because a fine rewiring layer can be formed on the thin film layer, this is suitable for formation of the rewiring layer.

As seen in Table 1, the cured materials of the resin compositions obtained in Examples are superior in both the dielectric loss tangent and the tensile modulus of elasticity. Therefore, the cured material of the resin composition is suitable as the material for an insulating layer.

In Examples 1 to 4, even in the case that the (D) to (F) components were absent, it was confirmed that similar results to those in Examples described above could be obtained, although the results were different to some extent.

Where a numerical limit or range is stated herein, the endpoints are included. Also, all values and subranges within a numerical limit or range are specifically included as if explicitly written out.

As used herein the words "a" and "an" and the like carry the meaning of "one or more."

Obviously, numerous modifications and variations of the present invention are possible in light of the above teachings. It is therefore to be understood that, within the scope of the appended claims, the invention may be practiced otherwise than as specifically described herein.

All patents and other references mentioned above are incorporated in full herein by this reference, the same as if set forth at length.

The invention claimed is:

1. A cured product formed of a cured material obtained by curing a resin composition, comprising:
    (A) at least one epoxy resin;
    (B) at least one curing agent; and
    (C) at least one inorganic filler,
    wherein the cured product has a ground surface,
    a maximum depth of a depressed portion present on the ground surface is less than 10 μm,
    the cured material has a dielectric loss tangent of 0.008 or less measured at 60 GHZ,
    the cured material has a tensile modulus of elasticity of 5 Gpa or more and 20 Gpa or less at 25° C.
    the (C) inorganic filler has been subjected to a surface treatment with an amino silane compound,
    the (C) inorganic filler includes a hollow filler particle having a hollow portion formed inside thereof, and
    the hollow portion of the hollow filler particle included in said component (C) has a maximum long diameter of less than 5 μm.

2. The cured product according to claim 1, wherein said component (B) comprises a phenol-based curing agent or an acid anhydride-based curing agent.

3. The cured product according to claim 1, wherein said component (C) has an average particle diameter of 0.5 μm to 20 μm.

4. The cured product according to claim 1, wherein
    the ground surface includes a filler surface part formed by grinding of said component (C), and
    a depressed portion having a depth of less than 10 μm is formed on the filler surface part.

5. The cured product according to claim 1, wherein the cured product is for formation of a rewiring layer on the ground surface.

6. The cured product according to claim 1, wherein the cured product is included in a structural body in combination with a connection terminal portion having a surface portion that is flush with the ground surface, and the cured product is for formation of a rewiring layer on the ground surface.

7. The cured product according to claim 1, wherein the cured product is for formation of a rewiring layer after a thin film layer is formed on the ground surface.

8. A method for producing the cured product according to claim 1, said method comprising:
    (a) forming a resin composition layer of the resin composition;
    (b) curing the resin composition to obtain a cured product; and
    (c) grinding the cured product.

9. The cured product according to claim 1, wherein the resin composition further comprises an (E) organic filler.

10. The cured product according to claim 1, wherein the (C) inorganic filler further comprises alumina.

11. The cured product according to claim 1, wherein the (A) epoxy resin comprises a combination of a liquid epoxy resin and a solid epoxy resin.

12. A resin sheet, comprising a support and a resin composition layer comprising a resin composition, said resin composition layer being provided on the support, wherein
    said resin composition comprises:
    (A) at least one epoxy resin;
    (B) at least one curing agent; and
    (C) at least one inorganic filler,
    wherein
    when said resin composition is cured at 180° C. for 1 hour, and then ground to form a ground surface having an arithmetic average roughness of 500 nm or less, a maximum depth of a depressed portion present on the ground surface is less than 10 μm,
    when said resin composition is cured at 180° C. for 90 minutes to obtain a cured material, the cured material has a dielectric loss tangent of 0.008 or less measured at 60 GHZ,
    the cured material has a tensile modulus of elasticity of 5 Gpa or more and 20 Gpa or less at 25° C., and
    the (C) inorganic filler has been subjected to a surface treatment with an amino silane compound.

13. A resin composition, comprising:
    (A) at least one epoxy resin;
    (B) at least one curing agent; and
    (C) at least one inorganic filler,
    wherein said resin composition is a liquid resin composition,
    wherein
    when the resin composition is cured at 180° C. for 1 hour, and then ground to form a ground surface having an arithmetic average roughness of 500 nm or less, a maximum depth of a depressed portion present on the ground surface is less than 10 μm, when said resin composition is cured at 180° C. for 90 minutes to obtain a cured material, the cured material has a dielectric loss tangent of 0.008 or less measured at 60 GHz, the cured material has a tensile modulus of elasticity of 5 Gpa or more and 20 Gpa or less at 25° C., and the (C) inorganic filler has been subjected to a surface treatment with an amino silane compound.

14. A resin composition for obtaining a cured product having a ground surface to form a rewiring layer thereon, wherein the resin composition comprises:
(A) at least one epoxy resin;
(B) at least one curing agent; and
(C) at least one inorganic filler,
wherein
an average particle diameter of said component (C) is 0.5 μm to 20 μm,
said component (C) is treated with an amino silane compound,
said component (C) includes a hollow filler particle having a hollow portion formed inside thereof,
the hollow portion of the hollow filler particle included in said component (C) has a maximum long diameter of less than 5 μm, when said resin composition is cured at 180° C. for 90 minutes to obtain a cured material, the cured material has a dielectric loss tangent of 0.008 or less measured at 60 GHZ, and the cured material has a tensile modulus of elasticity of 5 Gpa or more and 20 Gpa or less at 25° C.

15. A cured product formed of a cured material obtained by curing a resin composition, comprising:
(A) at least one epoxy resin;
(B) at least one curing agent; and
(C) at least one inorganic filler,
wherein the cured product has a ground surface,
a maximum depth of a depressed portion present on the ground surface is less than 10 μm,
the cured material has a dielectric loss tangent of 0.008 or less measured at 60 GHZ,
the cured material has a tensile modulus of elasticity of 5 Gpa or more and 20 Gpa or less at 25° C.
the (C) inorganic filler has been subjected to a surface treatment with an amino silane compound, and
the cured product is included in a structural body in combination with a connection terminal portion having a surface portion that is flush with the ground surface, and the cured product is for formation of a rewiring layer on the ground surface.

* * * * *